(12) United States Patent
Okada et al.

(10) Patent No.: US 7,952,183 B2
(45) Date of Patent: May 31, 2011

(54) HIGH CAPACITY MEMORY WITH STACKED LAYERS

(75) Inventors: Yasuo Okada, Yokohama (JP); Kiyokazu Okada, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 221 days.

(21) Appl. No.: 12/259,539

(22) Filed: Oct. 28, 2008

(65) Prior Publication Data

US 2009/0108470 A1 Apr. 30, 2009

(30) Foreign Application Priority Data

Oct. 29, 2007 (JP) .............................. P2007-280345
Jan. 23, 2008 (JP) .............................. P2008-012217
Apr. 15, 2008 (JP) .............................. P2008-105582

(51) Int. Cl.
*H01L 23/02* (2006.01)
(52) U.S. Cl. ........ 257/686; 257/679; 257/723; 257/777; 257/E25.013
(58) Field of Classification Search .................. 257/686, 257/723, 777, E25.013, 679
See application file for complete search history.

(56) References Cited

U.S. PATENT DOCUMENTS

| 6,538,331 | B2 | 3/2003 | Masuda et al. |
| 6,621,155 | B1* | 9/2003 | Perino et al. .................. 257/686 |
| 6,686,663 | B2 | 2/2004 | Masuda et al. |
| 6,717,251 | B2* | 4/2004 | Matsuo et al. ................ 257/686 |
| 7,342,309 | B2 | 3/2008 | Yoshida |
| 7,432,128 | B2 | 10/2008 | Yoshida |
| 7,704,794 | B2* | 4/2010 | Mess et al. .................... 438/112 |
| 2007/0218588 | A1* | 9/2007 | Takiar et al. .................. 438/109 |
| 2007/0228509 | A1* | 10/2007 | Okada et al. .................. 257/503 |
| 2008/0235939 | A1* | 10/2008 | Hiew et al. ..................... 29/831 |

FOREIGN PATENT DOCUMENTS

| JP | 2001-217383 | 8/2001 |
| JP | 2005-302871 | 10/2005 |
| JP | 2006-313798 | 11/2006 |
| JP | 2007-293800 | 11/2007 |

* cited by examiner

*Primary Examiner* — Wael M Fahmy
*Assistant Examiner* — John C Ingham
(74) *Attorney, Agent, or Firm* — Oblon, Spivak, McClelland, Maier & Neustadt, L.L.P.

(57) ABSTRACT

A element group includes a plurality of semiconductor elements stacked in a step-like shape on a wiring board. The semiconductor elements are electrically connect to connection pads of the wiring board through metal wires. Among the plural semiconductor elements stacked in a step-like shape, the uppermost semiconductor element has a thickness larger than that of the semiconductor element immediately below it.

18 Claims, 20 Drawing Sheets

HIGH CAPACITY MEMORY WITH STACKED LAYERS

CROSS-REFERENCE TO RELATED APPLICATIONS

This application is based upon and claims the benefit of priority from the prior Japanese Patent Applications No. 2007-280345 filed on Oct. 29, 2007, No. 2008-012217 filed on Jan. 23, 2008 and No. 2008-105582 filed on Apr. 15, 2008; the entire contents of which are incorporated herein by reference.

BACKGROUND OF THE INVENTION

1. Field of the Invention

The present invention relates to a semiconductor device.

2. Description of the Related Art

A memory card (semiconductor memory card) having a NAND-type flash memory therein is downsized and provided with high capacity rapidly. For realization of a downsized memory card, semiconductor elements such as a memory element and a controller element are mounted in a stacked form on a wiring board. The electrode pads of the semiconductor elements are electrically connected to the connection pads of the wiring board by wire bonding. Besides, to provide the memory card with high capacity, the memory elements have come to be stacked into multiple layers on the wiring board.

The stacked number of memory elements is increasing and it is being studied to stack them into four, eight or more layers depending on the storage capacity of the memory card. To perform wire bonding of the semiconductor elements (memory elements) stacked into multiple layers, for example, a structure that the semiconductor elements are stacked into a step-like shape to expose the electrode pads of the semiconductor elements is applied (see JP-A 2001-217383(KOKAI), JP-A 2005-302871(KOKAI)). The semiconductor elements stacked on the wiring board are sealed with a mold resin after the electrode pads are electrically connected with the connection pads of the wiring board through metal wires.

The thickness of the semiconductor element such as a memory element tends to be decreased smaller and smaller in order to stack into multiple layers on the wiring board year by year. Besides, when plural semiconductor elements are stacked into a step-like shape, an end of the upper semiconductor element has an eaves-like state, namely a so-called overhang state, protruded from the lower semiconductor element. When the semiconductor elements whose thickness is decreased are stacked into a step-like shape, it is worried that various problems are caused due to the thickness and the overhang structure of the semiconductor elements. For example, there is a problem that the semiconductor element is warped or cracked at the time of wire bonding.

Besides, to realize a memory card with high capacity, provision of the memory element itself with higher integration and higher capacity based on it is being conducted in addition to the improvement of the stacked structure of the semiconductor elements on the wiring board. The outer shape of the memory element tends to become large when it is provided with high capacity. The outer shape of the memory card is specified, and its leading end is provided with a slope portion for indication of the forward and backward direction and the front and rear surface direction of the card (see JP-A 2007-293800(KOKAI)). In a case where a large memory element is mounted on a wiring board having a specified outside dimension, the slope portion which is provided at the leading end of the memory card becomes a factor of restricting the size of the semiconductor element mountable on the wiring board.

SUMMARY OF THE INVENTION

A semiconductor device according to a first aspect of the present invention includes: a wiring board having a first surface provided with external connection terminals and a second surface provided with an element mounting section and connection pads; an element group provided with a plurality of semiconductor elements having electrode pads arranged along one outline side, the semiconductor elements being stacked in a step-like shape on the element mounting section of the wiring board; metal wires electrically connecting the electrode pads of the semiconductor elements and the connection pads of the wiring board; and a sealing resin layer formed on the second surface of the wiring board to seal the element group together with the metal wires, wherein the uppermost semiconductor element in the element group has a thickness larger than that of the semiconductor element immediately below it.

A semiconductor device according to a second aspect of the present invention includes: a wiring board having a first surface provided with external connection terminals and a second surface provided with an element mounting section and connection pads; an element group, mounted on the element mounting section of the wiring board, including at least one semiconductor element having electrode pads arranged along a outline side; metal wires electrically connecting the connection pads of the wiring board and the electrode pads of the semiconductor element; a sealing resin layer formed on the second surface of the wiring board to seal the element group together with the metal wires; and a slope portion formed on ends of the wiring board and the sealing resin layer ranging from the first surface of the wiring board to the sealing resin layer, wherein the semiconductor element is arranged on the wiring board via a dummy element having a size which fits in an outer shape of the wiring board, and an end of the semiconductor element is protruded from the end of the wiring board to locate above the slope portion.

A semiconductor device according to a third aspect of the present invention includes: a wiring board having a first surface provided with external connection terminals and a second surface provided with an element mounting section and connection pads; an element group, mounted on the element mounting section of the wiring board, including at least one semiconductor element having electrode pads arranged along a outline side; metal wires electrically connecting the connection pads of the wiring board and the electrode pads of the semiconductor element; a sealing resin layer formed on the second surface of the wiring board to seal the element group together with the metal wires; and a slope portion formed on ends of the wiring board and the sealing resin layer ranging from the first surface of the wiring board to the sealing resin layer, wherein the semiconductor element is arranged on the wiring board via an adhesive layer having an incline corresponding to the slope portion, and an end of the semiconductor element is protruded from the end of the wiring board to locate above the slope portion.

A semiconductor device according to a fourth aspect of the present invention includes: a wiring board having a first surface provided with external connection terminals and a second surface provided with an element mounting section and connection pads; an element group, mounted on the element mounting section of the wiring board, including at least one semiconductor element having electrode pads arranged along a outline side; metal wires electrically connecting the connection pads of the wiring board and the electrode pads of the semiconductor element; a sealing resin layer formed on the second surface of the wiring board to seal the element group together with the metal wires; and a slope portion formed on ends of the wiring board and the sealing resin layer ranging from the first surface of the wiring board to the sealing resin layer, wherein the semiconductor element has an incline corresponding to the slope portion, and an end of the semiconductor element is protruded from the end of the wiring board to locate above the slope portion.

A semiconductor device according to a fifth aspect of the present invention includes: a substrate; an element group provided with a plurality of semiconductor elements mounted on the substrate, the plurality of semiconductor elements being stacked in a state sequentially displaced in one direction to have one ends as exposed sections and the other ends forming an eaves-like portion; and a circuit member mounted on a part of the substrate corresponding to a position below the eaves-like portion.

DETAILED DESCRIPTION OF THE INVENTION

Modes of conducting the present invention will be described below with reference to the drawings.

Figure 1:
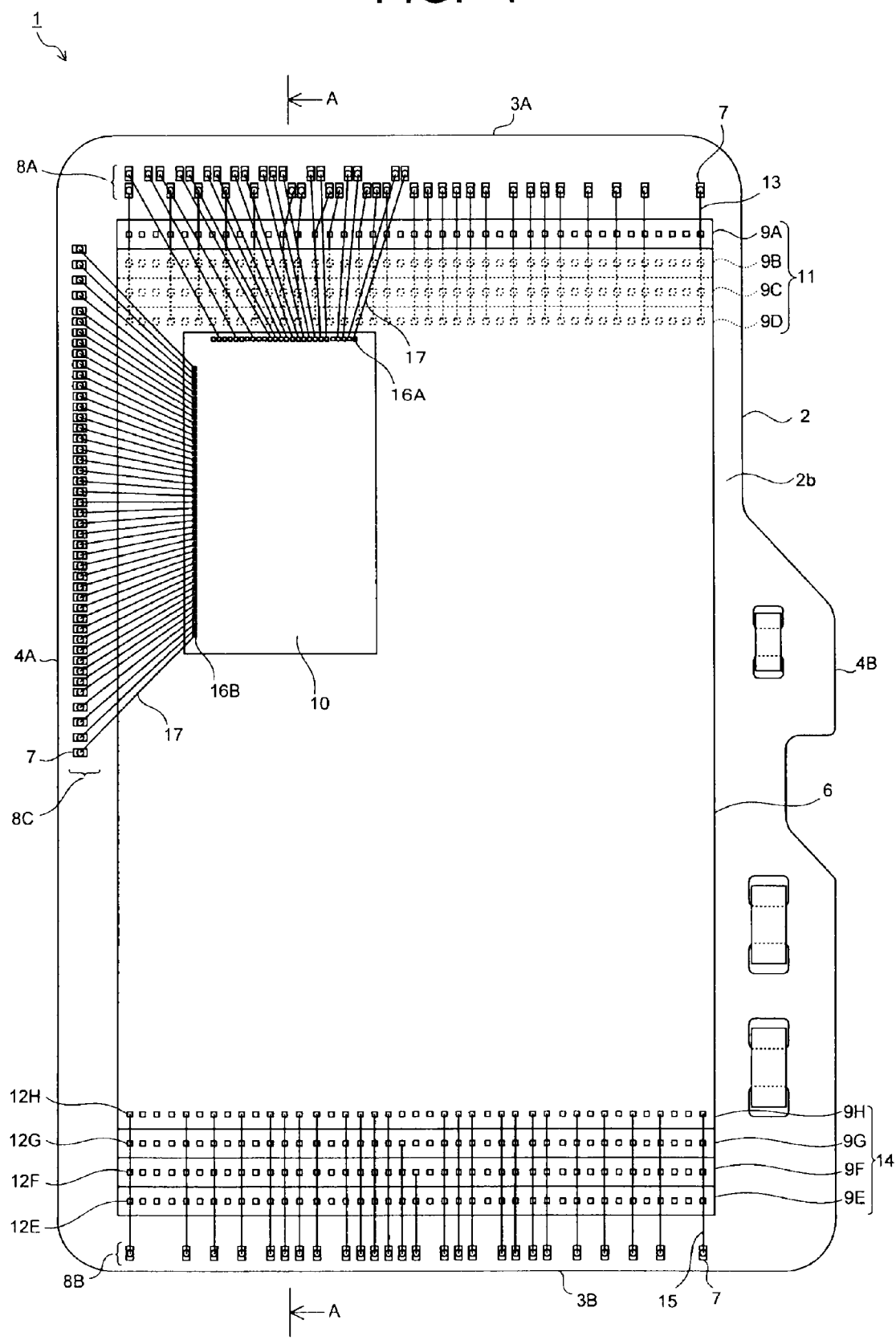
FIG. 1 is a plan view showing a semiconductor memory device (memory card) according to a first embodiment.
Figure 2:
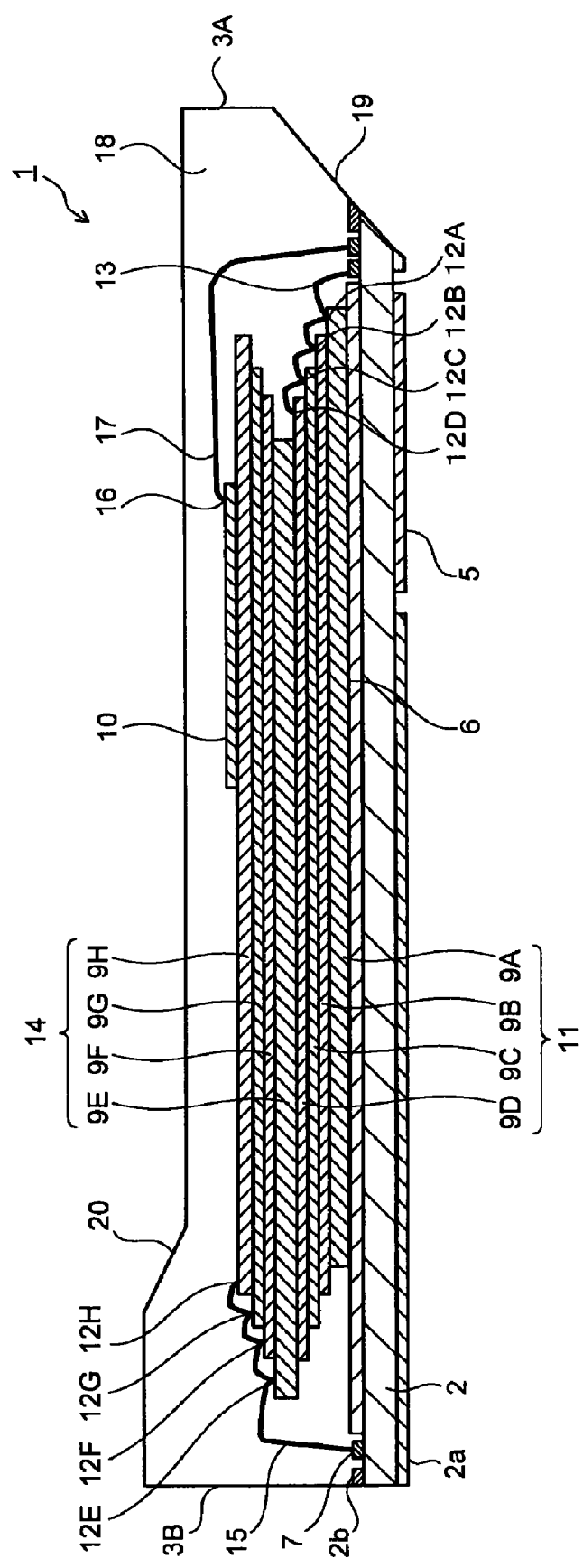
FIG. 2 is a sectional view taken along line A-A of FIG. 1.

FIG. 1 and FIG. 2 are diagrams showing structures of a semiconductor memory device (semiconductor device) according to a first embodiment of the present invention. FIG. 1 is a plan view of the semiconductor memory device. FIG. 2 is a sectional view (sectional view cut in a long side direction) taken along line A-A of FIG. 1. The semiconductor memory device (semiconductor device) 1 shown in FIG. 1 and FIG. 2 solves disadvantages due to a thickness and an overhang structure of plural semiconductor elements at the time when they are stacked in a step-like fashion on a wiring board.

When the plural semiconductor elements are stacked into a step-like shape, an end of the upper semiconductor element has an eaves-like state, namely a so-called overhang state, protruded from the lower semiconductor element. Therefore, the end protruded into the eaves shape of the semiconductor element tends to be warped. Since the uppermost semiconductor element does not have on its top an element or the like to prevent warping, a warp tends to occur particularly. The warp of the semiconductor element becomes significant when its thickness is decreased to 50 µm or less, and further to 30 µm or less. The semiconductor memory device 1 suppresses warping or the like which results from the thickness or the overhang structure of the semiconductor element. A specific structure of the semiconductor memory device 1 is described below.

The semiconductor memory device 1 configures a semiconductor memory card (e.g., micro SD™ card). The semiconductor memory device 1 is provided with a wiring board 2 which serves as an element-mounting substrate and a terminal-forming substrate. For example, the wiring board 2 has wiring networks provided within and on the front surface of an insulating resin substrate, and specifically a printed circuit board using a glass-epoxy resin, a BT resin (bismaleimide triazine resin) or the like is applied. The wiring board 2 has a first surface 2a which becomes a terminal formation surface and a second surface 2b which becomes an element-mounted surface.

The wiring board 2 has a substantially rectangular profile. One short side 3A of the wiring board 2 corresponds to a leading end of a memory card when it is inserted into a card slot. The other short side 3B corresponds to the rear end of the memory card. One long side 4A of the wiring board 2 has a linear shape, and the other long side 4B has a cutout portion and a recess portion to indicate the forward and backward direction and the front and rear surface direction of the memory card. Each corner of the wiring board 2 has a curved shape (R shape).

An external connection terminal 5 which becomes an input/output terminal of the memory card is formed on the first surface 2a of the wiring board 2. The external connection terminal 5 is formed of a metal layer which is formed by electrolytic plating or the like. The first surface 2a of the wiring board 2 corresponds to the front surface of the memory card. A first wiring network (not shown) is provided in a region excepting a region, where the external connection terminal 5 is formed, on the first surface 2a of the wiring board 2. The first wiring network has test pads of the memory card. The first wiring network provided on the first surface 2a is covered with an insulating layer (not shown) using an insulating adhesive seal or adhesive tape.

The second surface 2b of the wiring board 2 has an element mounting section 6 and a second wiring network including connection pads 7. The second surface 2b of the wiring board 2 corresponds to the back surface of the memory card. The second wiring network having the connection pads 7 is electrically connected to the external connection terminal 5 and the first wiring network through unshown internal wiring (through holes etc.) of the wiring board 2. The connection pads 7 are arranged on a first pad region 8A along the short side 3A, a second pad region 8B along the short side 3B and a third pad region 8C along the long side 4A.

Plural memory elements (semiconductor elements) 9 are stacked on the element mounting section 6 of the second surface 2b of the wiring board 2. The plural memory elements (semiconductor elements) 9 are stacked to have a step-like shape to configure a memory element group (element group). For example, the memory element 9 is a semiconductor memory element such as a NAND-type flash memory. A controller element (semiconductor element) 10 is stacked on the memory element 9. The controller element 10 selects an element from the plural memory elements 9 to write and read data to and from it, writes data into the selected memory element 9, or reads data which is stored in the selected memory element 9.

A first memory element 9A, a second memory element 9B, a third memory element 9C and a fourth memory element 9D which configure a first memory element group (first element group) 11 are sequentially stacked on the second surface 2b of the wiring board 2. The first through fourth memory elements 9A to 9D have the same rectangular shape and are provided with electrode pads 12A to 12D. The first through fourth electrode pads 12A to 12D are arranged along one outline side, and specifically along one short side, of the first through fourth memory elements 9A to 9D. The first through fourth memory elements 9A to 9D have a single-short-side pad structure.

The first memory element 9A is adhered onto the element mounting section 6 of the wiring board 2 via an adhesive layer (not shown) with its surface (electrode formation surface) having the first electrode pads 12A directed upward. For the adhesive layer, a die attach film (adhesive agent film) which is mainly composed of a general polyimide resin, epoxy resin, acrylic resin or the like is used. It is also used for the adhesive layer of the other memory elements 9. The first memory element 9A is arranged with a pad arrangement side (one short side) directed toward the short side 3A of the wiring board 2. The first memory element 9A is arranged to position the electrode pads 12A near the first pad region 8A of the wiring board 2.

The second memory element 9B is adhered onto the first memory element 9A via an adhesive layer (not shown) with its surface (electrode formation surface) having the second electrode pads 12B directed upward and the first electrode pads 12A exposed. Similarly, the third memory element 9C is adhered onto the second memory element 9B. The fourth memory element 9D is adhered onto the third memory element 9C. The second through fourth memory elements 9B to 9D are sequentially stacked in a step-like shape on the first memory element 9A with the pad arrangement sides directed to the same direction as the first memory element 9A and the electrode pads 12 of the lower memory element 9 exposed.

The first through fourth memory elements 9A to 9D are stacked in a step-like shape with the short sides displaced in the long side direction with the respective pad arrangement sides directed in the same direction and the long sides aligned to expose the electrode pads 12 of the lower memory element 9. Therefore, the electrode pads 12A to 12D of the first through fourth memory elements 9A to 9D are positioned in a state exposed upward near the first pad region 8A. The electrode pads 12A to 12D of the first through fourth memory elements 9A to 9D are electrically connected to the connection pads 7 which are arranged in the first pad region 8A through first metal wires 13.

When the first through fourth electrode pads 12A to 12D have the same electric properties and signal characteristics, they can be connected sequentially by the first metal wires 13. In other words, the fourth electrode pads 12D and the third electrode pads 12C are connected by the metal wires 13. Similarly, the metal wires 13 are used to connect between the third electrode pads 12C and the second electrode pads 12B and between the second electrode pads 12B and the first electrode pads 12A. Lastly, the first electrode pads 12A and the connection pads 7 are connected by the metal wires 13. Wire bonding of the individual pads 12 may be conducted independently or they may be connected sequentially by a single metal wire.

A fifth memory element 9E, a sixth memory element 9F, a seventh memory element 9G and an eighth memory element 9H which configure a second memory element group (second element group) 14 are sequentially stacked on the first memory element group 11. The fifth through eighth memory elements 9E to 9H have the same rectangular shape and electrode pads 12E to 12H. The fifth through eighth electrode pads 12E to 12H are arranged along one outline sides, specifically one short sides, of the fifth through eighth memory elements 9E to 9H. The fifth through eighth memory elements 9E to 9H have a single-short-side pad structure.

The fifth memory element 9E is adhered onto the fourth memory element 9D located on the uppermost level of the first memory element group 11 via an adhesive layer (not shown) with its surface (electrode formation surface) having the fifth electrode pads 12E directed upward. The fifth memory element 9E is stacked in a state displaced in the long side direction so as to expose the electrode pads 12D of the fourth memory element 9D. The fifth memory element 9E is arranged with a pad arrangement side directed toward the short side 3B of the wiring board 2. The fifth memory element 9E is arranged with the pad arrangement side directed to the opposite direction as the first memory element 9A to position the fifth electrode pads 12E near the second pad region 8B of the wiring board 2.

The sixth memory element 9F is adhered onto the fifth memory element 9E via an adhesive layer (not shown) with its surface (electrode formation surface) having the sixth electrode pads 12F directed upward and the fifth electrode pads 12E exposed. Similarly, the seventh memory element 9G is adhered onto the sixth memory element 9F. The eighth memory element 9H is adhered onto the seventh memory element 9G. The sixth through eighth memory elements 9F to 9H are stacked in a step-like shape on the fifth memory element 9E with the pad arrangement sides directed to the same direction as the fifth memory element 9E and the electrode pads 12 of the lower memory element 9 exposed.

The second memory element group 14 is stacked in a step-like shape in a direction opposite to the stepped direction (direction toward the upper level of the elements stacked into the step-like shape) of the first memory element group 11 with the pad arrangement side directed to the opposite direction as the first memory element group 11. The fifth through eighth memory elements 9E to 9H are stacked in a step-like shape with their pad arrangement sides directed to the opposite direction from the first memory element group 11, their long sides aligned, and the electrode pads 12 of the lower memory element 9 exposed.

The electrode pads 12E to 12H of the fifth through eighth memory elements 9E to 9H are positioned in a state exposed upward near the second pad region 8B of the wiring board 2. The electrode pads 12E to 12H of the fifth through eighth memory elements 9E to 9H are electrically connected to the connection pads 7 which are arranged in the second pad region 8B through second metal wires 15. A thin metal wire such as a general Au wire or Cu wire is used for the metal wires 13, 15. It is also used for metal wires 17 described later.

When the fifth through eighth electrode pads 12E to 12H have the same electric properties and signal characteristics, they can be connected sequentially by the second metal wires 15. In other words, the eighth electrode pads 12H and the seventh electrode pads 12G are connected by the metal wires 15. Similarly, the metal wires 15 are used to connect between the seventh electrode pads 12G and the sixth electrode pads 12F and between the sixth electrode pads 12F and the fifth electrode pads 12E. Lastly, the fifth electrode pads 12E and the connection pads 7 are connected by the metal wires 15. Wire bonding of the individual pads 12 may be conducted independently or they may be connected sequentially by a single metal wire.

The controller element 10 is adhered onto the second memory element group 14 via an adhesive layer (not shown). The controller element 10 has an L-shaped pad structure, which is provided with electrode pads 16 which are arranged along a first outline side (short side) and a second outline side (long side) which is orthogonal with it. The electrode pads 16A of the controller element 10 are electrically connected to the connection pads 7 arranged in the first pad region 8A via third metal wires 17. The electrode pads 16B are electrically connected to the connection pads 7 arranged in the third pad region 8C through the third metal wires 17.

A sealing resin layer 18 formed of, for example, an epoxy resin is mold formed on the second surface 2b of the wiring board 2 on which the memory elements 9 and the controller element 10 are mounted. The memory elements 9 and the controller element 10 are integrally sealed together with the metal wires 13, 15, 17 and the like by the sealing resin layer 18. A slope portion 19 is formed on a leading end of the sealing resin layer 18 to indicate the front of the memory card. A tab 20 is formed at a rear part of the sealing resin layer 18 by partially protruding the sealing resin. Thus, the semiconductor memory device 1 which is used as a semiconductor memory card is configured. The sealing resin layer 18 is not shown in FIG. 1.

The semiconductor memory device 1 configures solely a semiconductor memory card (e.g., micro SD™ standard memory card) without using a housing case such as a base card. Therefore, the sealing resin layer 18 or the like is in a state directly exposed outside. The semiconductor memory device 1 is a casing-less semiconductor memory card that the sealing resin layer 18 and the like are exposed outside. Therefore, a cutout portion, a recess portion and the slope portion 19 indicating the forward and backward direction, the front and rear surface direction and the like of the semiconductor memory card are formed on the semiconductor memory device 1 itself.

The semiconductor memory device 1 of this embodiment suppresses an increase in the occupied area of the memory elements 9A to 9H with respect to the wiring board 2 with the electrode pads 12A to 12H exposed by inverting the stepped directions of the first memory element group 11 and the second memory element group 14. When all the eight memory elements are stacked into a step-like shape, the occupied area of the memory elements becomes an area resulting from the addition of the areas of the displaced portions of the seven semiconductor memory elements to the area of one semiconductor memory element.

Meanwhile, the element occupied area of the semiconductor memory device 1 becomes an area resulting from the addition of the area of the displaced portion of the fifth memory element 9E displaced to expose the fourth electrode pads 12D to the occupied area (area resulting from the addition of the areas of the displaced portions of the three semiconductor memory elements to the area of one memory element 9) of the first memory element group 11. An increase in the occupied area of the memory elements 9 with respect to the wiring board 2 can be suppressed by stacking the memory elements 9 with the stepped direction of the first memory element group 11 inverted to the stepped direction of the second memory element group 14.

It is preferable that the thickness of each of the memory elements 9 configuring the first and second memory element groups 11, 14 is decreased in order to increase the stacked number. But, when the thickness of all the memory elements 9 is equally decreased, a problem occurs depending on the stacked position of the memory elements 9. For example, the second memory element group 14 is configured by stacking the plural memory elements 9E to 9H in a step-like shape, so that the end of the upper memory element 9 has an eaves-like state (overhang state) protruded from the lower memory element 9. Therefore, the memory element 9 tends to be warped.

Among the plural memory elements 9A to 9H stacked in the step-like shape, there is no semiconductor element on the top of the uppermost eighth memory element 9H, and particularly on the eaves-like protruded end portion. Therefore, the uppermost memory element 9H tends to warp, and the eaves-like protruded end portion (overhang portion) tends to have a large warp amount. Since the metal wires 17 connected to the controller element 10 are wired on the top of the overhang portion of the eighth memory element 9H, there is a possibility of causing a short circuit due to contact with the metal wires 17 if the overhang portion of the eighth memory element 9H has a large warp amount.

Accordingly, among the plural memory elements 9A to 9H configuring the first and second memory element groups 11, 14, the thickness of the uppermost eighth memory element 9H is increased to be larger than that of the memory element 9G positioned at a lower level (immediately below). Thus, the warp amount of the eighth memory element 9H which tends to be warped by the influence of the overhang portion can be reduced by increasing the thickness of the uppermost memory element 9H among the plural memory elements 9A to 9H stacked in the step-like shape. As a result, a short circuit or the like due to the contact with the metal wires 17 because of the warp of the overhang portion of the eighth memory element 9H can be suppressed.

Since the lowermost fifth memory element 9E among the plural memory element 9E to 9H configuring the second memory element group 14 is arranged in a state displaced with respect to the first memory element group 11, its end having the electrode pads 12E is protruded from the fourth memory element 9D. Therefore, the electrode pads 12E of the fifth memory element 9E have a hollow state below them, and there is a possibility of deflection at the time of wire bonding to the electrode pads 12E. The deflection of the memory element 9 becomes a cause of a defective connection of the metal wires 15 or an element crack.

Accordingly, it is preferable that the thickness of the fifth memory element 9E is increased to be larger than that of the memory element 9F which is positioned at an upper level (immediately above). Thus, it becomes possible to prevent a defective connection or an element crack from occurring at the time of wire bonding to the fifth electrode pads 12E. It is preferable that the thickness of the memory elements 9F, 9G other than the lowermost and uppermost memory elements 9E, 9H is decreased in a range not deteriorating the productivity and wire bonding property of the memory elements 9 in order to prevent the stacked thickness of the memory elements 9 from increasing and the stacked number from decreasing as a result.

Since the lowermost first memory element 9A among the plural memory elements 9A to 9D configuring the first memory element group 11 is arranged on an uneven portion (uneven portion due to a level difference because of the presence or not of the wiring layer, a level difference because of a through hole portion, a level difference because of the terminals or test pads) which is on the front surface of the wiring board 2, a large pressure may be locally added at the time of mold-forming of the sealing resin layer 18. If the first memory element 9A is made excessively thin, there is a possibility of cracking because of a localized pressure applied at the time of mold forming.

Therefore, it is preferable that the thickness of the first memory element 9A is increased to be larger than that of the memory element 9B which is positioned at its upper level (immediately above). Thus, a crack of the first memory element 9A by a localized pressure at the time of mold forming of the sealing resin layer 18 can be prevented. It is preferable that the thickness of the memory elements 9B, 9C, 9D other than the lowermost memory element 9A is decreased in a range not deteriorating the productivity and wire bonding property of the memory elements 9 in order to prevent the stacked thickness of the memory elements 9 from increasing and the stacked number from decreasing as a result.

It is preferable that the thickness T of the memory elements 9B to 9D other than the lowermost memory element 9A in the first memory element group 11 and the thickness T of the memory elements 9F to 9G other than the lowermost and uppermost memory elements 9E, 9H in the second memory element group 14 are in a range of 10 to 50 µm. If the thickness T of the memory elements 9B to 9D and 9F to 9G exceeds 50 µm, the memory elements 9 have an excessively large stacked thickness. Meanwhile, it is hard to adjust the thickness T to less than 10 µm in terms of the element production process, and a crack occurs easily at the time of production or handling.

The thickness T1 of the uppermost memory element 9H in the second memory element group 14 is made larger than the thickness T of the other memory elements 9B to 9D and 9F to 9G (T1>T). In addition, it is preferable that the thickness T1 of the uppermost memory element 9H is in a range of 1.1 to 1.5 T to the thickness T of the other memory elements 9. If the thickness T1 of the uppermost memory element 9H is less than 1.1 T, the warp of the uppermost memory element 9H cannot be suppressed effectively. For suppression of the warp of the uppermost memory element 9H, it is effective to increase the thickness T1, but if the thickness T1 is excessively increased, the stacked thickness of the memory elements 9 is increased. It is preferable that the thickness T1 of the uppermost memory element 9H is 1.5 T or less for practical purposes.

It is preferable that the thickness T2 of the lowermost memory element 9E in the second memory element group 14 is made larger than the thickness T of the other memory elements 9B to 9D and 9F to 9G (T2>T). The thickness T2 of the fifth memory element 9E is preferably in a range of 2.5 T to 3.5 T to the thickness T of the other memory elements 9. If the thickness T2 of the fifth memory element 9E is less than 2.5 T, there is a possibility that a defective connection or an element crack cannot be suppressed at the time of wire bonding. For improvement of the wire bonding property to the fifth memory element 9E, it is effective to increase the thickness T2, but the stacked thickness is increased if the thickness T2 is increased excessively. It is preferable that the thickness T2 of the fifth memory element 9E is 3.5 T or less for practical purposes.

It is preferable that thickness T3 of the lowermost memory element 9A in the first memory element group 11 is larger than the thickness T of the other memory elements 9B to 9D and 9F to 9G (T3>T). It is more preferable that the thickness T3 of the first memory element 9A is in a range of 1.5 to 2.5 T with respect to the thickness T of the other memory elements 9. If the thickness T3 of the first memory element 9A is less than 1.5 T, there is a possibility that an element crack by a localized pressure cannot be suppressed at the time of mold-forming. For prevention of a crack in the first memory element 9A, it is effective to increase the thickness T3, but the stacked thickness is increased if the thickness T3 is excessively increased. It is preferable that the thickness T3 of the first memory element 9A is 2.5 T or less for practical purposes.

As described above, it is determined that the thickness T1 of the eighth memory element 9H is in a range of 1.1 T to 1.5 T, and the thickness T2 of the fifth memory element 9E is in a range of 2.5 T to 3.5 T. Thus, the contact with the metal wires 17 because of the warp of the uppermost eighth memory element 9H among the memory elements stacked into a step-like shape and the occurrence of a defective connection or an element crack at the time of wire bonding to the fifth memory element 9E are prevented, and an increase in the stacked thickness of the memory elements 9 can be suppressed. In addition, since the thickness T3 of the first memory element 9A is in a range of 1.5 T to 2.5 T, a crack in the lowermost memory element 9A by a localized pressure is prevented at the time of mold-forming, and an increase in the stacked thickness of the memory elements 9 can be suppressed.

Thus, it becomes possible to realize a thin and high capacity semiconductor memory device 1 while maintaining the reliability and production yield of the semiconductor memory device 1. In a case where a memory card is configured of the semiconductor memory device 1, the stacked thickness (element thickness) of the memory elements 9 and the controller element 10 is required to be within the thickness standard (e.g., 700 µm) of the memory card with the addition of the thickness of the wiring board 2 and the thickness (an on-element resin thickness) of the sealing resin layer 18 on the controller element 10. By satisfying the thickness of the memory elements 9A to 9H described above, both a decrease in element thickness and suppression of defect occurrence can be made by stacking the plural memory elements 9 to provide high capacity. In other words, the reliability and production yield of a thin and high capacity semiconductor memory device 1 can be enhanced.

For example, it is determined that the wiring board 2 has a thickness of 125 µm, the first memory element 9A has a thickness of 60 µm, its adhesive layer has a thickness of 20 µm, the second through fourth elements 9B to 9D each have a thickness of 30 µm, the adhesive layer for them has a thickness of 5 µm, the fifth memory element 9E has a thickness of 90 µm, its adhesive layer has a thickness of 5 µm, the sixth and seventh semiconductor element 9E to 9G each have a thickness of 30 µm, their adhesive layer has a thickness of 5 µm, the eighth memory element 9H has a thickness of 40 µm, its adhesive layer has a thickness of 5 µm, the controller element 10 has a thickness of 30 µm, its adhesive layer has a thickness of 5 µm, and the sealing resin layer 18 has an on-element resin thickness of 145 μm. Then, a total thickness becomes 700 μm, which makes it possible to satisfy the memory card thickness standard.

A very thin memory element 9 having a thickness of 10 to 50 μm can be produced by applying, for example, a production method described below. First, a semiconductor wafer having an element region on its surface is prepared. Grooves having a prescribed depth are formed from the surface of the semiconductor wafer by a blade or the like. It is determined that the grooves have a depth which is larger than the thickness of the completed element. Then, a protection tape is pasted to the front surface of the semiconductor wafer in which the grooves are formed, and the back surface of the semiconductor wafer is ground and polished to provide a desired element thickness. By the grinding and polishing processes to reach the grooves, the semiconductor elements are singulated while the semiconductor wafer is being held by the protection tape.

Then, a protection tape integrated with an adhesive agent film (a die attach film or the like) is pasted to the back surface of the semiconductor wafer, and only the protection tape is removed. Then, laser light is emitted along the shapes of the semiconductor elements divided by the grooves to cut the adhesive agent film pasted to the back surface of the semiconductor wafer according to the shapes of the semiconductor elements. Thus, the semiconductor elements having the singulated adhesive agent film can be obtained. A combination of previous dicing of the semiconductor wafer and cutting of the adhesive agent film with laser light enables to obtain very thin semiconductor elements, to which the adhesive agent film is pasted, with a good reproducibility.

In the semiconductor memory device 1 of the first embodiment, the mounted number (stacked number) of the memory elements 9 is not limited to eight, but it is adequate if the number of the memory elements 9 configuring the first and second element groups 11, 14 is plural. In order to provide the semiconductor memory device 1 with high capacity, the number of the memory elements 9 configuring the first and second memory element groups 11, 14 is preferably four or more (a total of eight or more). When eight memory elements 9 having a storage capacity of 1 GB are used, an 8-GB semiconductor memory card can be realized. Thus, a thin and high capacity memory card can be provided by the semiconductor memory device 1.

Figure 3:
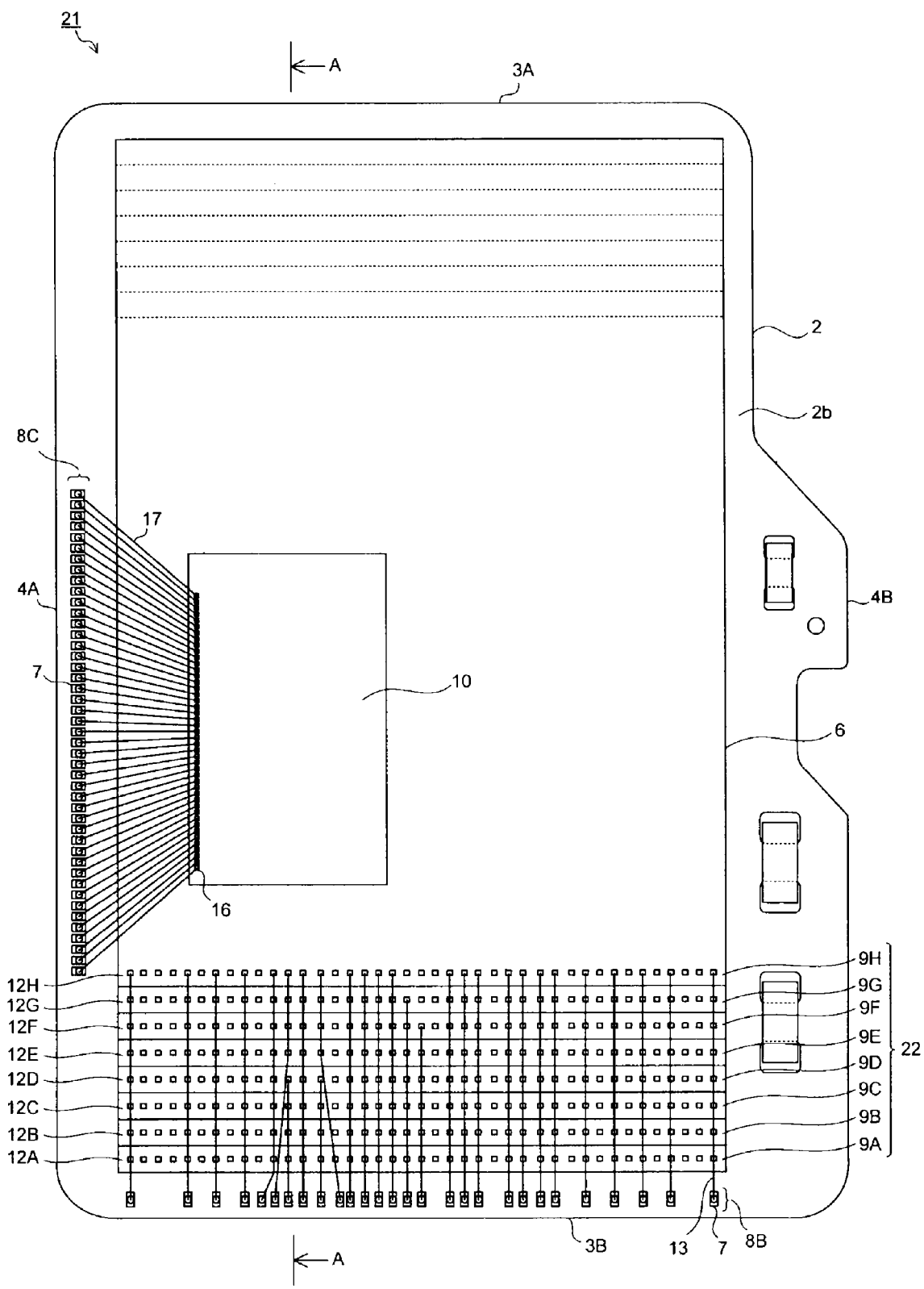
FIG. 3 is a plan view showing a semiconductor memory device (memory card) according to a second embodiment.
Figure 4:
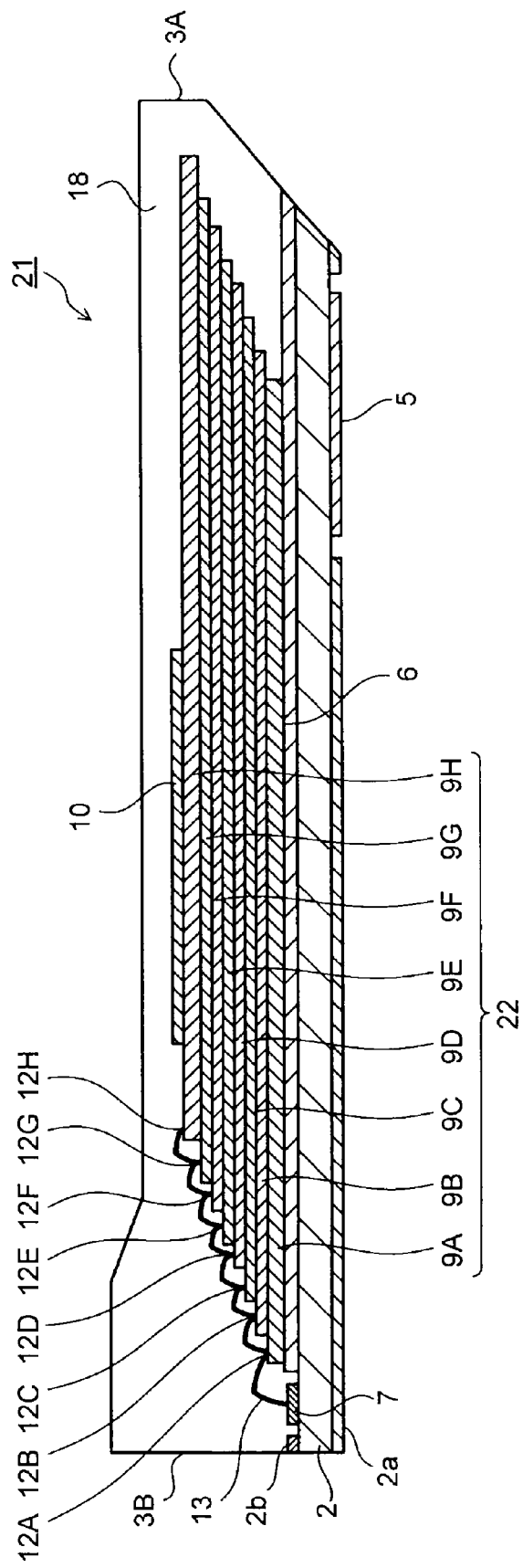
FIG. 4 is a sectional view taken along line A-A of FIG. 3.

In the first embodiment, the structure that the first memory element group 11 and the second memory element group 14 having the opposite stepped directions were stacked on the wiring board 2 was described. But, the structure of the semiconductor device is not limited to the above. As shown in FIG. 3 and FIG. 4, plural memory elements (semiconductor elements) 9 may be stacked sequentially in a step-like shape on the wiring board 2. FIG. 3 and FIG. 4 are diagrams showing the structure of a semiconductor memory device (semiconductor device) 21 according to a second embodiment. In FIG. 3 and FIG. 4, like component parts corresponding to those of FIG. 1 and FIG. 2 are denoted by like reference numerals.

The first through eighth memory elements 9A to 9H have the same rectangular shape. The electrode pads 12A to 12H are arranged along one short sides of the memory elements 9A to 9H. The first memory element 9A is arranged with the pad arrangement side (short side) directed to the short side 3B of the wiring board 2 to position the electrode pads 12A near the pad region 8B.

Similarly, the second through eighth memory elements 9B to 9H are stacked in a step-like shape on the first memory element 9A with the pad arrangement sides (one short sides) directed to the same direction as the first memory element 9A to expose the electrode pads 12A to 12H upward. The first through eighth memory elements 9A to 9H configure a memory element group 22. The first through eighth memory elements 9A to 9H are stacked into a step-like shape with the pad arrangement sides directed to the same direction and displaced in one direction to expose the electrode pads 12 of the lower memory element 9.

The first through eighth memory elements 9A to 9H are stacked in a step-like shape. Therefore, one short sides which are opposed to the other short sides where the electrode pads 12 are arranged are sequentially protruded in an eaves shape. When the eaves-like portion of the laminated body of the memory elements 9 is long, the eighth memory element 9H which is positioned on the top of the memory element group 22 has a particularly large warp amount. Therefore, there is a possibility that sealing of the memory elements 9 by the sealing resin layer 18 becomes defective or the memory elements 9 are made defective by a pressure applied when the sealing resin layer 18 is mold-formed.

In such a case, among the plural memory elements 9A to 9H configuring the memory element group 22, it is effective to increase the thickness of the uppermost eighth memory element 9H to a level larger than that of the lower (immediately below) memory element 9G. Thus, it becomes possible to prevent the occurrence of defective sealing or defective elements due to warping of the eighth memory element 9H.

It is preferable that the thickness of the lowermost first memory element 9A is larger than that of the upper (immediately above) memory element 9B similar to the first embodiment. It is preferable that the thickness of the other memory elements 9B to 9G is decreased to a level not deteriorating the productivity and wire bonding property of the memory elements 9 in order to prevent the stacked thickness of the memory elements 9 from increasing.

Thickness T of the memory elements 9B to 9G excepting the lowermost and uppermost memory elements 9A, 9H is preferably in a range of 10 to 50 μm similar to the first embodiment. Thickness T1 of the uppermost memory element 9H is preferably in a range of 1.1 T to 1.5 T to the thickness T of the memory elements 9B to 9G. Thickness T3 of the lowermost memory element 9A is preferably in a range of 1.5 T to 2.5 T to the thickness T of the memory elements 9B to 9G. The reason of specifying the thickness is same as in the first embodiment. It is possible to realize the semiconductor memory device 1 which is thin and has high capacity while maintaining its reliability and production yield.

The semiconductor memory devices 1, 21 of the first and second embodiments are effective for a casingless semiconductor memory card which is solely configured of them. But a semiconductor memory card using a casing such as a base card is not necessarily excluded. Besides, they can also be applied to a semiconductor memory device other than the semiconductor memory card. Specifically, the device structure of the embodiment can also be applied to a semiconductor device having a BGA package structure or an LGA package structure. The semiconductor device has a basic structure similar to the semiconductor memory devices 1, 21, excepting that external connection terminals (ball terminals) formed of solder balls or the like are provided on the first surface 2a of the wiring board 2.

Figure 5:
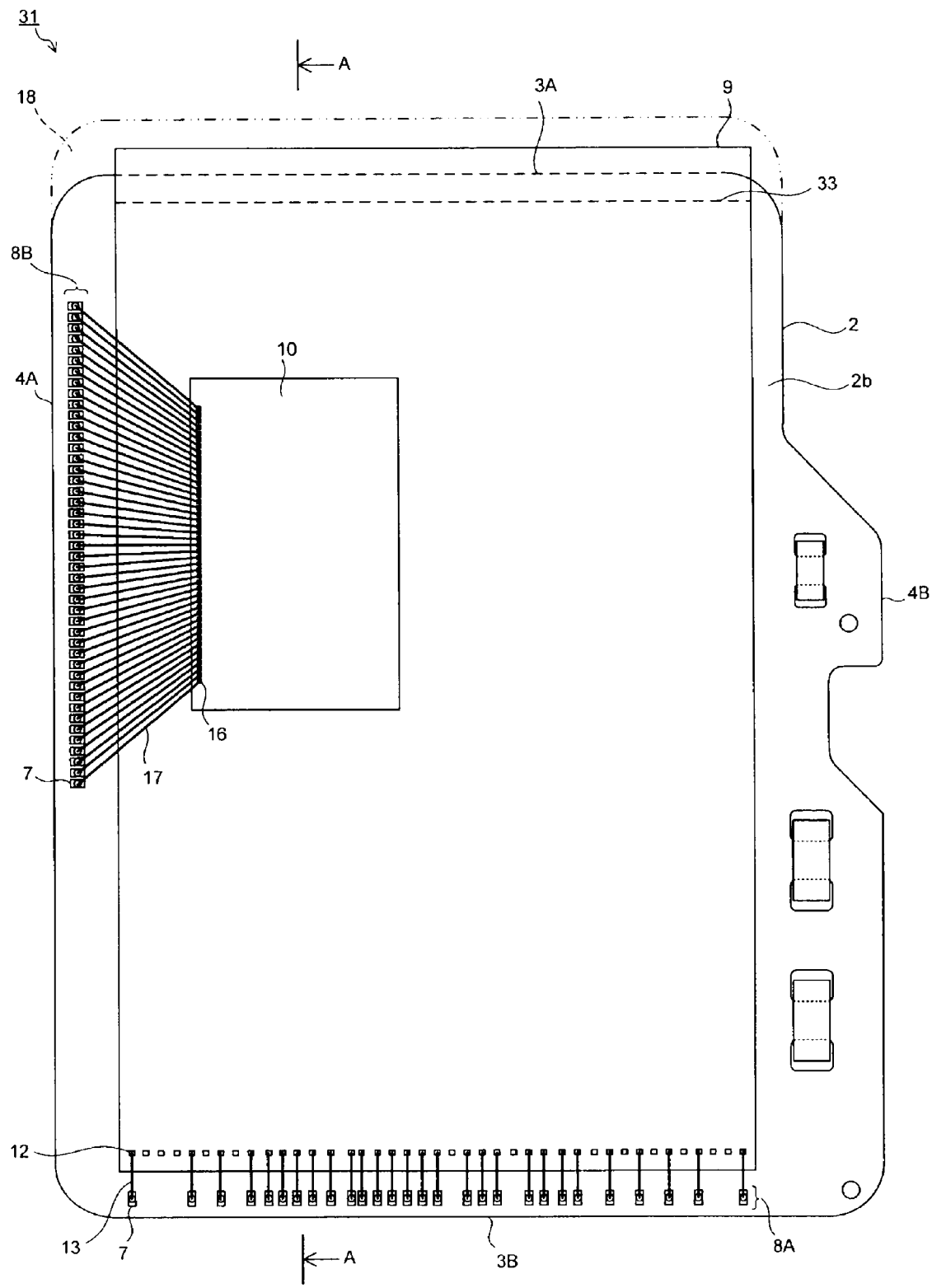
FIG. 5 is a plan view showing a semiconductor memory device (memory card) according to a third embodiment.
Figure 6:
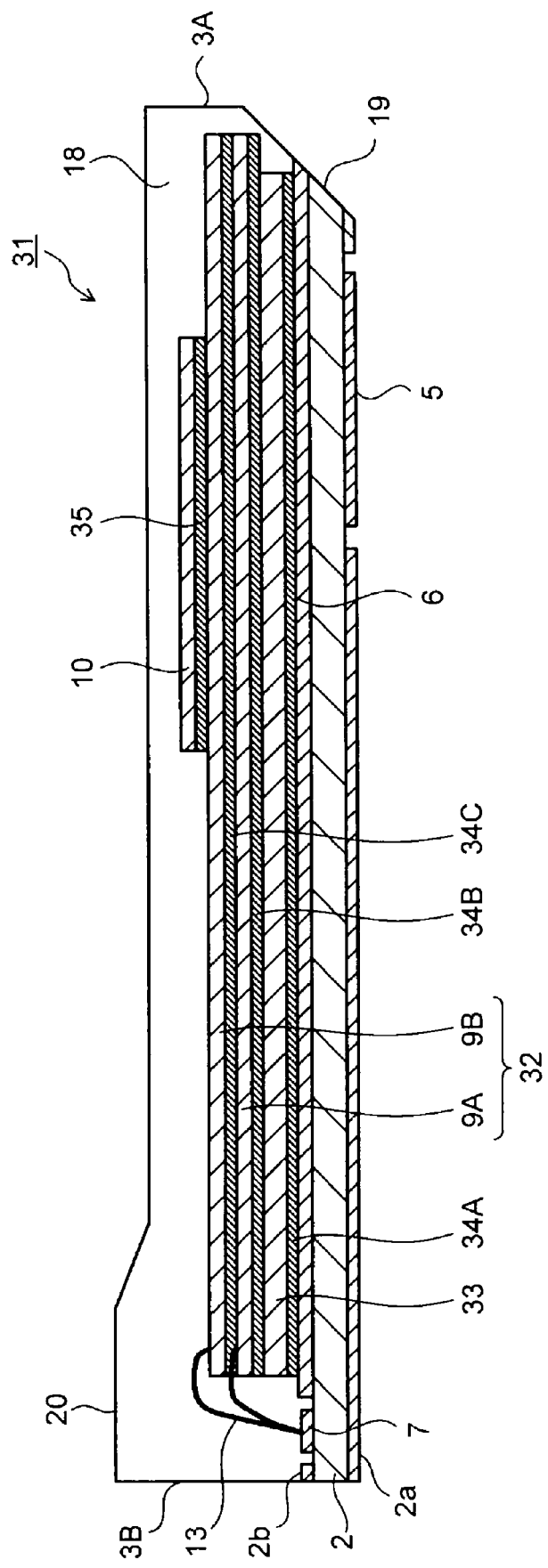
FIG. 6 is a sectional view taken along line A-A of FIG. 5.
Figure 7:
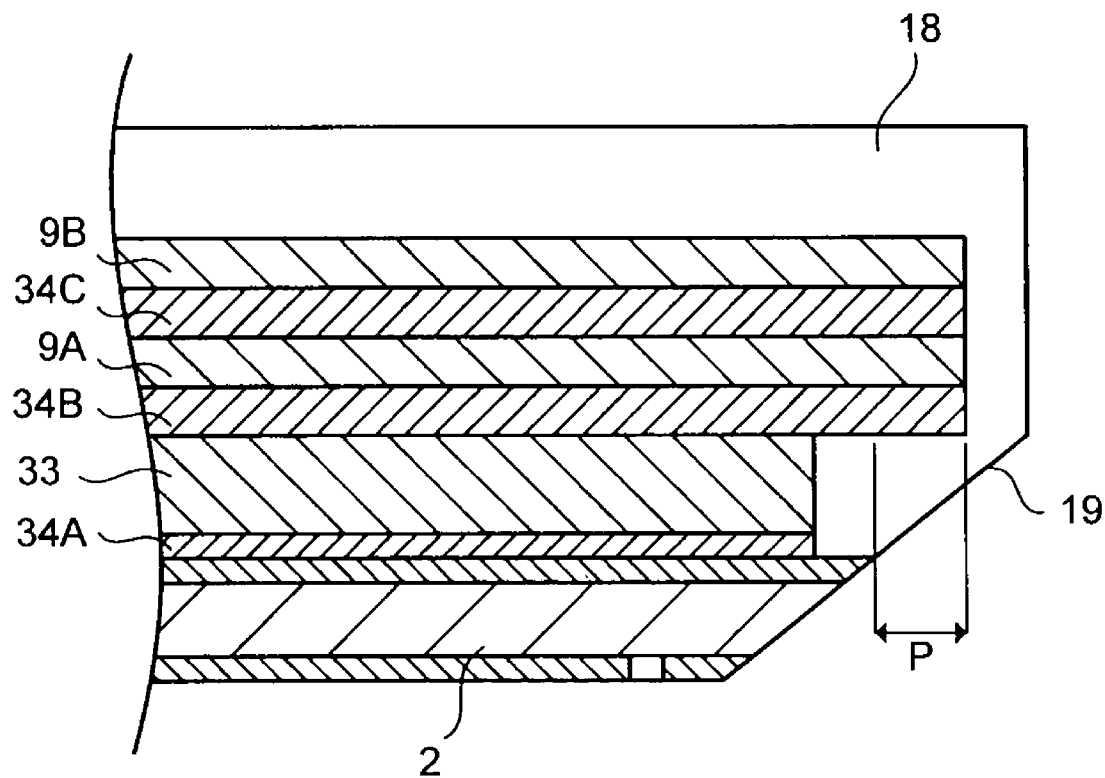
FIG. 7 is a sectional view showing FIG. 6 in a partly enlarged form.

A semiconductor device according to a third embodiment of the present invention is described below with reference to FIG. 5, FIG. 6 and FIG. 7. FIG. 5 is a plan view showing a semiconductor memory device (semiconductor device) according to the third embodiment. FIG. 6 is a sectional view (sectional view cut in a long side direction) taken along line A-A of FIG. 5. FIG. 7 is a sectional view showing FIG. 6 in a partly enlarged form. In FIG. 5 through FIG. 7, like component parts corresponding to those of FIG. 1 through FIG. 4 are denoted by like reference numerals.

The semiconductor memory device 31 shown in FIG. 5 through FIG. 7 is used, for example, as an SD™ standard memory card (such as a micro SD™ card). The memory card 31 is provided with the wiring board 2 which serves as an element-mounting substrate and a terminal-forming substrate. One long side 4A of the wiring board 2 has a linear shape, while the other long side 4B has a cutout portion and a recess portion to indicate the forward and backward direction and the front and rear surface direction of the memory card 31. The slope portion 19 is formed at the leading end of the memory card 31 from the first surface 2a of the wiring board 2 to the sealing resin layer 18.

The external connection terminal 5 which becomes an input/output terminal of the memory card 31 is formed on the first surface 2a of the wiring board 2. The first surface 2a has a first wiring network (not shown). The second surface 2b of the wiring board 2 has an element mounting section 6 and a second wiring network including the connection pad 7. The second wiring network is electrically connected to the external connection terminal 5 and the first wiring network through unshown internal wirings of the wiring board 2. The connection pads 7 are arranged in the first pad region 8A along the short side 3B and in the second pad region 8B along the long side 4A.

Plural memory elements (semiconductor elements) 9A, 9B are mounted on the second surface 2b of the wiring board 2. The memory elements 9A, 9B configure an element group 32. A controller element (semiconductor element) 10 is stacked on the element group 32. The controller element 10 selects a memory element 9 from the plural memory elements 9A, 9B to write and read data to and from it, writes data into the selected memory element 9, or reads data stored in the selected memory element 9.

The element group 32 is mounted on the wiring board 2 via a dummy element 33 having a size to be housed into the outer shape of the wiring board 2. In other words, a dummy element (practically, a semiconductor element which does not function or is not functioned as memory element) 33 is adhered to the element mounting section 6 of the wiring board 2 via a first adhesive layer 34A. The dummy element 33 has a shape which fits in the outer shape of the wiring board 2 (outer shape of the wiring board 2 having the slope portion 19) when the slope portion 19 is formed by partially removing the leading ends of the wiring board 2 and the sealing resin layer 18.

The dummy element 33 has a thickness such that when the plural memory elements 9A, 9B are stacked thereon, the ends of the plural memory elements 9A, 9B are protruded from the end (the leading end of the wiring board 2 having the slope portion 7) of the wiring board 2 and located above the slope portion 19 formed on the sealing resin layer 18. In other words, the plural memory elements 9A, 9B are raised by the dummy element 33 so that the plural memory elements 9A, 9B and the slope portion 19 do not interfere with one another. The dummy element 33 has a size that it is not interfered by the slope portion 19 and a thickness to raise the plural memory elements 9A, 9B such that they are not interfered by the slope portion 19.

Therefore, the memory elements 9A, 9B having a size to reach the above of the slope portion 19, namely the memory elements 9A, 9B having a portion (protruded portion P) protruded from the wiring board 2, can be mounted on the wiring board 2 without being interfered by the slope portion 19. Since a conventional memory card is limited to mounting of up to the largest semiconductor element which fits in the outer shape of the wiring board 2 having the slope portion 19, it is necessary that the size of the semiconductor element is decreased by a size corresponding to the slope portion in comparison with the size of the memory card. Meanwhile, since the ends of the memory elements 9 can be protruded from the wiring board 2, a memory element 9 larger for the protruded portion can be mounted.

The first memory element 9A is adhered to the dummy element 33 via a second adhesive layer 34B. The first memory element 9A has a shape that it is larger than the dummy element 33, and its leading end is protruded from the leading end of the wiring board 2 to locate above the slope portion 19. The element shape having an end located above the slope portion 19 means a shape that an appropriate distance is provided in a vertical direction (direction perpendicular to the substrate surface), and the element end overlaps the slope portion 19 of the sealing resin layer 18 in a planar view. The second memory element 9B is adhered onto the first memory element 9A via a third adhesive layer 34C. The first memory element 9A and the second memory element 9B have the same rectangular shape, and the individual ends are located above the slope portion 19 of the sealing resin layer 18.

The memory card 31 has as an element mounting region not only a substrate region (region based on the substrate outer shape) of the wiring board 2 having the slope portion 19 but also a region including the above of the slope portion 19 protruded from the wiring board 2. Therefore, the element size mountable on the memory card 31 is not restricted by the slope portion 19, and the memory element 9 corresponding to the size of the memory card 31 can be mounted. The mountable memory element 9 can be made large in comparison with a conventional memory card having only the substrate region of the wiring board 2 having the slope portion 19 as an element mounting region, and it becomes possible to mount a large memory element 9 conforming to the size of the memory card 31.

The first and second memory elements 9A, 9B have a single-short-side pad structure. The first and second memory elements 9A, 9B have the electrode pads 12 which are arranged along the outline side (one short side) located near the short side 3B of the wiring board 2. The first and second memory elements 9A, 9B are stacked on the second surface 2b of the wiring board 2 with the surface (electrode formation surface/circuit formation surface) having the electrode pads 12 directed upward.

The first memory element 9A and the second memory element 9B are stacked with the individual sides configuring the outer shape aligned. The first memory element 9A and the second memory element 9B are stacked with the long sides and short sides aligned such that an occupied area (element occupied area after stacking) of the memory elements 9A, 9B to the wiring board 2 becomes a minimum area (area corresponding to one memory element 9). Thus, it is made possible to mount the large memory elements 9A, 9B on memory card 31 having a specified size.

The electrode pads 12 of the first and second memory elements 9A, 9B are electrically connected to the connection pads 7 arranged in the first pad region 8A through the first metal wires 13. It is preferable that metal wires 13 are connected by applying reverse bonding capable of decreasing a loop height. Specifically, metal bumps are previously formed on the electrode pads 12. One ends of the metal wires 13 are ball connected to the connection pads 7, and the other ends are connected to the metal bumps formed on the electrode pads 12.

The metal wires 13 connected to the first memory element 9A are interfered by the second memory element 9B, resulting in a probability of occurrence of a defect such as a short circuit. The ends (element-side ends) of the metal wires 13 connected to the electrode pads 12 of the first memory element 9A located at the lower level are buried into the adhesive layer 34C of the second memory element 9B located at the upper level. Thus, the metal wires 13 and the second memory element 9B are prevented from contacting to one another. The metal wires 13 are separated from the second memory element 9B based on the thickness of the third adhesive layer 34C.

The third adhesive layer 34C also has a function as a spacer layer. The third adhesive layer 34C is formed of an insulating resin which has an adhesive function of the memory element 9 and a function of softening at a bonding temperature to take the metal wires 13 into it. Examples of such an insulating resin include a thermoplastic resin such as acrylic resin or a thermosetting resin such as epoxy resin. The adhesive layer 34C has a thickness of preferably in a range of 30 to 100 μm, and more preferably in a range of 40 to 60 μm.

If the third adhesive layer 34C has a thickness of less than 30 μm, there is a possibility that the contact of the metal wires 13 to the second memory element 9B cannot be prevented. If the third adhesive layer 34C has a thickness of more than 100 μm, the stacked thickness of the memory elements 9A, 9B becomes excessively large. For the first and second adhesive layers 34A, 34B, a die attach film (adhesive agent film) which is mainly composed of a general polyimide resin, epoxy resin, acrylic resin or the like is used.

FIG. 5 through FIG. 7 show the memory card 31 which has the element group 32 configured of two memory elements 9A, 9B, but the stacked number of the memory elements 9 is not limited to two. The element group 32 may be configured of three, four or more memory elements 9. The memory card 31 may have a structure that one memory element 9 is mounted on the wiring board 2. The number of the memory elements 9 mounted on the wiring board 2 may be either one or plural.

The controller element 10 is arranged on the element group 32. Specifically, the controller element 10 is adhered onto the second memory element 9B via an adhesive layer 35. The controller element 10 has a single-long-side pad structure and the electrode pads 16 which are arranged along an outline side (one long side) positioned near the long side 4A of the wiring board 2. The electrode pads 16 of the controller element 10 is electrically connected to the connection pads 7 arranged in the second pad region 8B through the second metal wires 17.

The sealing resin layer 18 is mold-formed on the second surface 2b of the wiring board 2 on which the memory elements 9A, 9B and the controller element 10 are mounted. The memory elements 9A, 9B and the controller element 10 are integrally sealed together with the metal wires 13, 17 and the like by the sealing resin layer 18. The memory card 31 has the slope portion 19. After the sealing resin layer 18 is mold-formed, the slope portion 19 is formed by chamfering from the first surface 2a of the wiring board 2 to the sealing resin layer 18. Since the memory elements 9A, 9B are raised by the dummy element 33, the slope portion 19 does not interfere with the memory elements 9A, 9B.

The memory card 31 of the third embodiment allows mounting of the memory element 9 which is as large as possible on the wiring board 2 whose shape and size are specified. Therefore, the memory card 31 can be provided with high capacity based on the memory element 9 having a shape according to the outer shape (size) of the memory element 9. For the mounted number of the memory elements 9, the connection structure and the like of the metal wires 13 are devised so that the large memory elements 9 can be mounted by stacking into plural levels. According to the third embodiment, it becomes possible to provide the memory card 31 provided with high capacity on the basis of the size and stacked structure of the memory elements 9.

Figure 8:
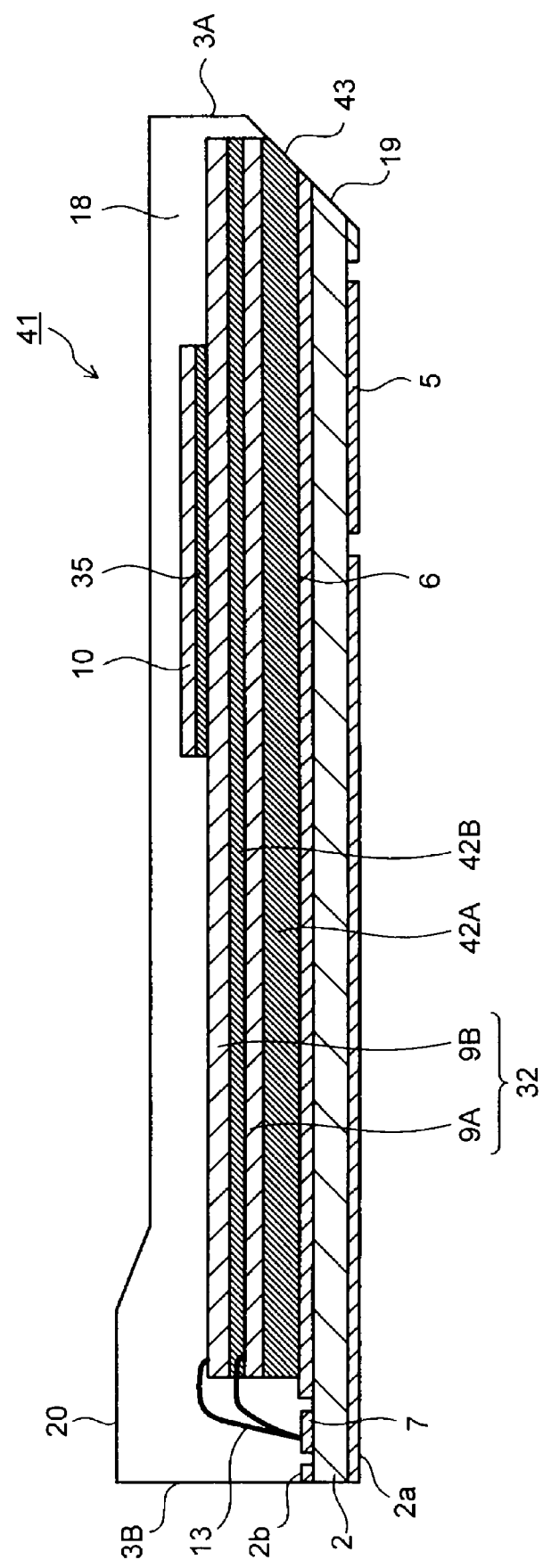
FIG. 8 is a sectional view showing a semiconductor memory device (memory card) according to a fourth embodiment.
Figure 9:
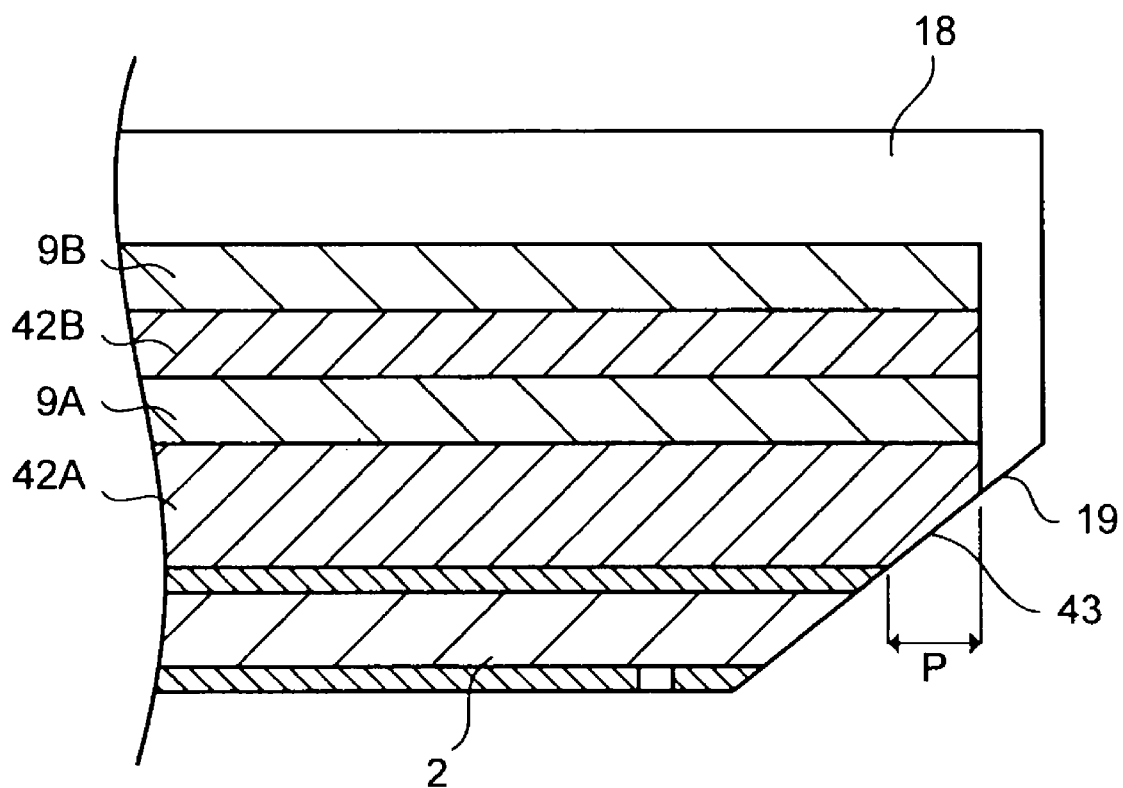
FIG. 9 is a sectional view showing FIG. 8 in a partly enlarged form.

A semiconductor device according to a fourth embodiment of the present invention is described below with reference to FIG. 8 and FIG. 9. FIG. 8 is a sectional view (sectional view cut in a long side direction) showing a semiconductor memory device (semiconductor device) according to the fourth embodiment. FIG. 9 is a sectional view showing FIG. 8 in a partly enlarged form. In FIG. 8 and FIG. 9, like component parts corresponding to those of FIG. 5 through FIG. 7 are denoted by like reference numerals. The semiconductor memory device 41 shown in FIG. 8 and FIG. 9 is used as, for example, an SD™ standard memory card (such as a micro SD™ card).

The memory card 41 has the same structure as that of the memory card 31 of the third embodiment excepting the mounting structure of the plural memory elements 9A, 9B on the wiring board 2 and the adhesive layer structure. A planar structure of the wiring board 2 on which the plural memory elements 9A, 9B are mounted is similar to the memory card 31 of the third embodiment excepting that a dummy element is not used. Therefore, the planar structure of the memory card 41 is not shown in the drawings. In the following description, FIG. 5 shall be referred if required for description on the planar structure of the memory card 41.

The first memory element (semiconductor element) 9A is adhered to the element mounting section 6 of wiring board 2 via a first adhesive layer 42A. The first memory element 9A has a shape that its end (leading end) is protruded from an end (leading end of the wiring board 2 having the slope portion 19) of the wiring board 2 and positioned above the slope portion 19 which is formed on the sealing resin layer 18. In a case where an adhesive layer having an ordinary thickness is used, the slope portion 19 interferes with the first memory element 9A at the time of forming the slope portion 19 from the first surface 2a of the wiring board 2 to the sealing resin layer 18.

Accordingly, the thickness of the first adhesive layer 42A is sufficiently increased in the fourth embodiment to raise the first memory element 9A by the first adhesive layer 42A. The first adhesive layer 42A of the fourth embodiment has the same effect as the dummy element 33 of the first embodiment. In other words, the first adhesive layer 42A has a thickness capable of raising the first memory element 9A such that it is not interfered by the slope portion 19. The first adhesive layer 42A having the thickness required for raising has its corner protruded from the leading end of the wiring board 2. The protruded portion is fabricated at the time of forming the slope portion 19 from the wiring board 2 to the sealing resin layer 18.

The first adhesive layer 42A has an incline (inclined plane) 43 corresponding to the slope portion 19. The incline 43 of the first adhesive layer 42A is formed by fabricating the corner of the first adhesive layer 42A when the second surface 2b of the wiring board 2 to the sealing resin layer 18 are chamfered after mold-forming the sealing resin layer 18 on the wiring board 2 on which the semiconductor elements 9, 10 are mounted. Since the first adhesive layer 42A has a sufficient thickness, the incline 43 is formed not by fabricating the whole thickness of the first adhesive layer 42A but by removing the corner of the first adhesive layer 42A. The thickness of the first adhesive layer 42A remains partially on the incline 43. Thus, the first memory element 9A is prevented from being interfered by the slope portion 19.

The second memory element 9B is adhered onto the first memory element 9A via a second adhesive layer 42B. The first memory element 9A and the second memory element 9B have the same rectangular shape and the individual ends are located above the slope portion 19 of the sealing resin layer 18. Thus, it becomes possible to mount the memory elements 9A, 9B having a size to reach the above of the slope portion 19 formed on the sealing resin layer 18, namely the memory elements 9A, 9B having a portion (protruded portion P) protruded from the wiring board 2, onto the wiring board 2 having the slope portion 19.

The memory card 41 has as an element mounting region not only a substrate region (region based on the substrate outer shape) of the wiring board 2 having the slope portion 19, but also a region including the above of the slope portion 19 protruded from the wiring board 2. Therefore, an element size mountable on the memory card 41 is not restricted by the slope portion 19, and the memory element 9 according to the size of the memory card 41 can be mounted.

Since a conventional memory card is limited to mounting of up to the largest semiconductor element which fits in the outer shape of the wiring board 2 having the slope portion 19, it is necessary that the size of the semiconductor element is decreased by a size corresponding to the slope portion in comparison with the size of the memory card. Meanwhile, the end of the memory element 9 is allowed to protrude from the wiring board 2 to make it possible to mount a large memory element 9 conforming to the size of the memory card 41.

The first and second memory elements 9A, 9B have a single-short-side pad structure similar to the third embodiment. The electrode pads 18 of the first and second memory elements 9A, 9B are electrically connected to the connection pads 7 arranged in the first pad region 8A through the first metal wires 13. The metal wires 13 connected to the first memory element 9A has the element-side ends buried into the adhesive layer 42B of the second memory element 9B similar to the third embodiment. The adhesive layer 42B is configured in the same manner as in the third embodiment.

FIG. 8 and FIG. 9 show the memory card 41 which has the element group 32 configured of two memory elements 9, but the stacked number of the memory elements 9 is not limited to two. The element group 32 may be configured of three, four or more memory elements 9. The memory card 41 may have a structure that one memory element 9 is mounted on the wiring board 2. The number of memory element 9 may be either one or plural.

The controller element 10 is arranged on the element group 32. The controller element 10 has a single-long-side pad structure. The electrode pads 16 of the controller element 10 are electrically connected to the connection pads 7 arranged in the second pad region 8B through the second metal wires 17. The sealing resin layer 18 is formed on the second surface 2b of the wiring board 2 on which the memory elements 9A, 9B and the controller element 10 are mounted. The memory elements 9A, 9B and the controller element 10 are integrally sealed together with the metal wires 13, 17 by the sealing resin layer 18.

The slope portion 19 which indicates the front of the memory card 41 is formed on the leading ends of the wiring board 2 and the sealing resin layer 18. After the sealing resin layer 18 is mold-formed, the slope portion 19 is chamfered from the first surface 2a of the wiring board 2 to the sealing resin layer 18. The corner of the first adhesive layer 42A is also chamfered to form the incline 43. The incline 43 is exposed to the slope portion 19. The first adhesive layer 42A has a thickness capable of raising the first memory element 9A, and only the corner of the first adhesive layer 42A is fabricated, so that the first memory element 9A is not interfered by the slope portion 19.

The memory card 41 of the fourth embodiment allows mounting of the memory element 9 which is as large as possible on the wiring board 2 whose shape and size are specified. Therefore, the memory card 41 can be provided with high capacity based on the outer shape (size) of the memory element 9. For the mounted number of the memory elements 9, the connection structure or the like of the metal wires 13 is devised as described above to make it possible to mount large memory elements 9 by stacking into plural levels. According to the fourth embodiment, it becomes possible to provide the memory card 41 provided with high capacity on the basis of the size and stacked structure of the memory elements 9.

Figure 10:
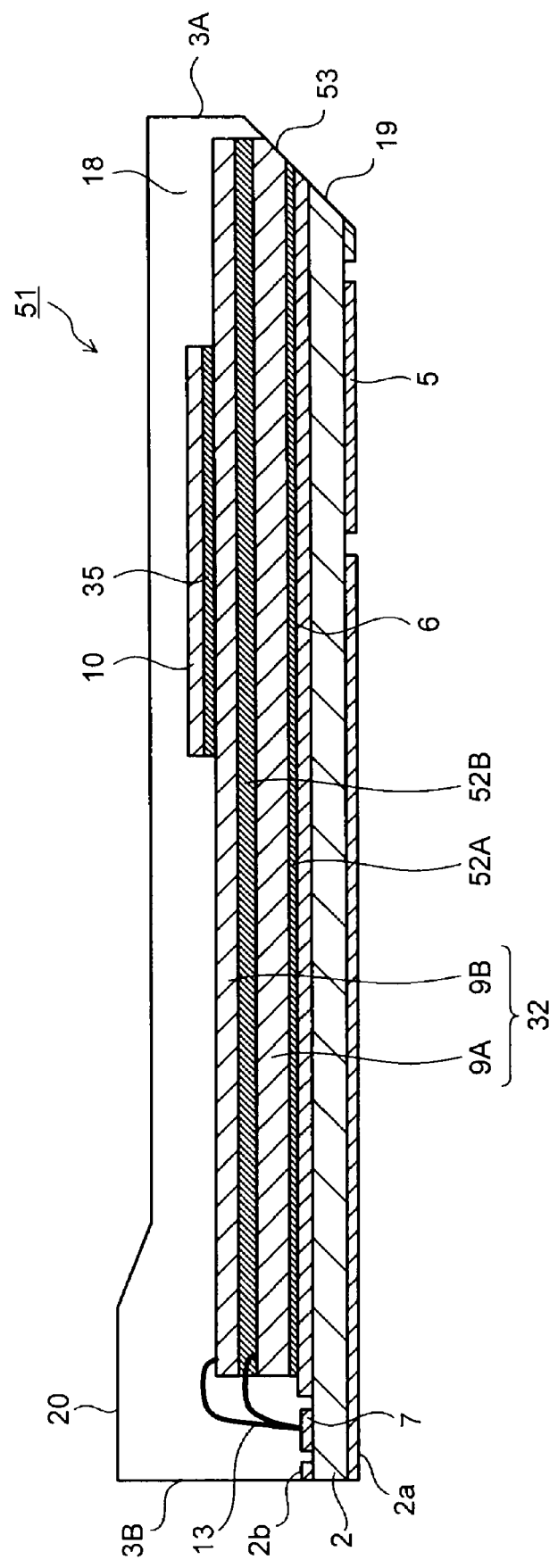
FIG. 10 is a sectional view showing a semiconductor memory device (memory card) according to a fifth embodiment.
Figure 11:
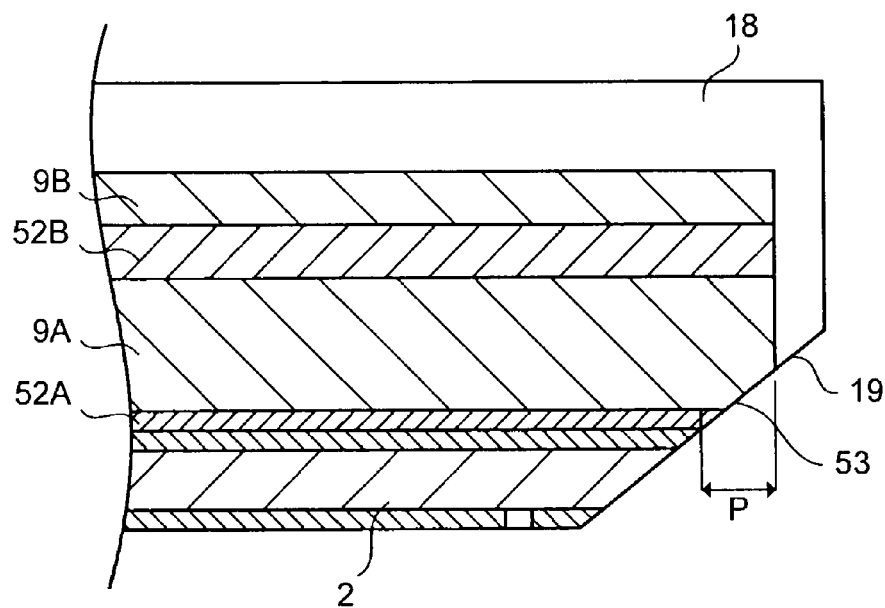
FIG. 11 is a sectional view showing FIG. 10 in a partly enlarged form.

A semiconductor device according to a fifth embodiment of the present invention is described below with reference to FIG. 10 and FIG. 11. FIG. 10 is a sectional view (sectional view cut in a long side direction) showing the semiconductor memory device (semiconductor device) according to a fifth embodiment. FIG. 11 is a sectional view of FIG. 10 in a partly enlarged form. In FIG. 10 and FIG. 11, like component parts corresponding to those of FIG. 5 through FIG. 9 are denoted by like reference numerals. A semiconductor memory device 51 shown in FIG. 10 and FIG. 11 is used, for example, as an SD™ standard memory card (such as a micro SD™ card).

The memory card 51 has a similar structure as that of the memory card 31 of the third embodiment excepting the mounting structure of plural memory elements 9A, 9B onto the wiring board 2 and the corner shape of the first memory element 9A. A planar structure of the wiring board 2 on which the plural memory elements 9A, 9B are mounted is similar to the memory card 31 of the third embodiment excepting that the dummy element is not used. Accordingly, a planar structure of the memory card 51 is not shown in the drawings. In the following description, FIG. 5 shall be referred if required for description on the planar structure of the memory card 51.

The first memory element (semiconductor element) 9A is adhered to the element mounting section 6 of the wiring board 2 via a first adhesive layer 52A. The first memory element 9A has a shape that its end (a leading end) is protruded from an end (a leading end of the wiring board 2 having the slope portion 19) of the wiring board 2 and positioned above the slope portion 19 which is formed on the sealing resin layer 18. In a case where the slope portion 19 is formed from the second surface 2b of the wiring board 2 to the sealing resin layer 18, the first memory element 9A having a portion P protruded from the leading end of the wiring board 2 is interfered by the slope portion 19.

Accordingly, a corner of the lowermost first memory element 9A is simultaneously fabricated at the time of forming the slope portion 19 in the fifth embodiment to form an incline 53 on an under corner of the first memory element 9A. The first memory element 9A of the fifth embodiment has the incline 53 corresponding to the slope portion 19. After the sealing resin layer 18 is mold-formed onto the wiring board 2 on which the memory elements 9 and the like are mounted, the incline 53 of the first memory element 9A is formed by simultaneously fabricating the corner of the first memory element 9A together with the first adhesive layer 52A when chamfering from the second surface 2b of the wiring board 2 to the sealing resin layer 18. The incline 53 is exposed to the slope portion 19.

In this case, when the corner of the first memory element 9A is merely chamfered, there is a possibility that the incline 53 reaches a circuit portion or a circuit formation surface (top surface) of the memory element 9A. Accordingly, when the corners of the first memory element 9A are chamfered to form the incline 53 in the fifth embodiment, the thickness of the first memory element 9A is set to a thickness that the incline 53 does not reach the circuit portion of the memory element 9A. A specific thickness of the first memory element 9A is adequately set according to a height fabricated simultaneously at the time of formation of the slope portion 19 and a formation depth of the circuit portion. It is adequate if the incline 53 does not reach the circuit portion of the memory element 9A when the corner of the first memory element 9A is chamfered.

The second memory element 9B is adhered onto the first memory element 9A via a second adhesive layer 52B. The second memory element 9B has an ordinary element shape. The first memory element 9A and the second memory element 9B have the same rectangular shape, and the individual ends are located above the slope portion 19 of the sealing resin layer 18. Thus, it becomes possible to mount the memory elements 9A, 9B having a size to reach the above of the slope portion 19 formed on the sealing resin layer 18, namely the memory elements 9A, 9B having a portion (protruded portion P) protruded from the wiring board 2 onto the wiring board 2 having the slope portion 19. The memory card 51 has as an element mounting region not only a substrate region of the wiring board 2, but also a region protruded from the wiring board 2.

Therefore, an element size mountable on the memory card 51 is not restricted by the slope portion 19, and the memory element 9 according to the size of the memory card 51 can be mounted. Since a conventional memory card is limited to mounting of up to the largest semiconductor element which fits in the outer shape of the wiring board 2 having the slope portion 19, it is necessary that the size of the semiconductor element is decreased by a size corresponding to the slope portion 19 in comparison with the size of the memory card. Meanwhile, the incline 53 is formed on the corner of the memory element 9 and the end of the memory element 9 is allowed to protrude from the wiring board 2 to make it possible to mount a large memory element 9 conforming to the size of the memory card 51.

Figure 12:
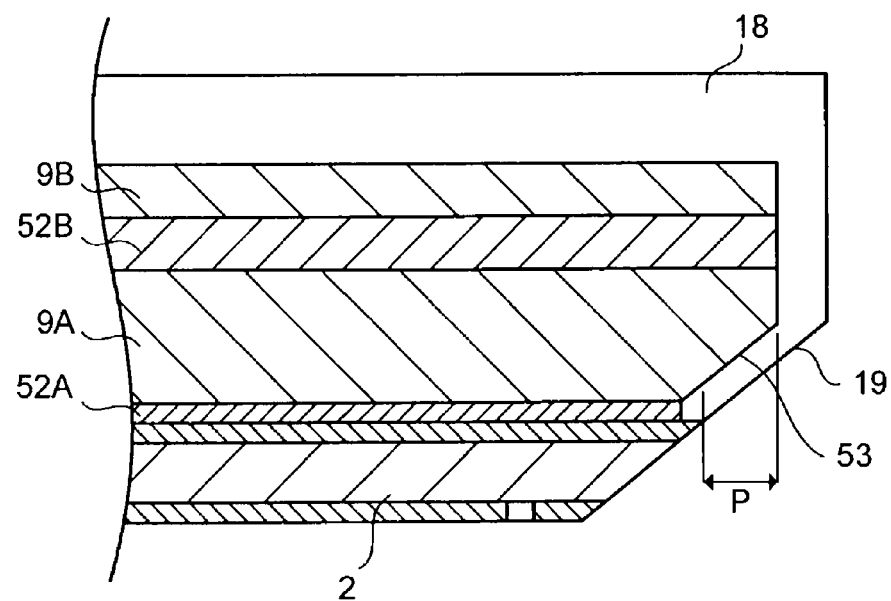
FIG. 12 is a sectional view showing a modified example of the semiconductor memory device shown in FIG. 10.

FIG. 10 and FIG. 11 show a structure that when chamfering is conducted from the wiring board 2 to the sealing resin layer 18, the incline 53 is formed by simultaneously fabricating the corner of the first memory element 9A. In this case, the incline 53 of the first memory element 9A is exposed to the slope portion 19. The incline 53 of the first memory element 9A may be buried into the sealing resin layer 18 as shown in FIG. 12. The structure shown in FIG. 12 is obtained by mounting on the wiring board 2 the first memory element 9A which has the incline 53 previously formed on the corner such that the undersurface shape of the first memory element 9A fits in the substrate region of the wiring board 2. Adoption of such a structure enables to prevent the incline 53 from being exposed to the slope portion 19 with the memory element 9 increased in size.

The first and second memory elements 9A, 9B have a single-short-side pad structure as in the third embodiment. The electrode pads 12 of the first and second memory elements 9A, 9B are electrically connected to the connection pads 7 arranged in the first pad region 8A through the first metal wires 13. The element-side ends of the first metal wires 13 connected to the first memory element 9A are buried into the adhesive layer 52B of the second memory element 9B as in the third embodiment. The adhesive layer 52B is configured in the same manner as in the third embodiment.

Figure 13:
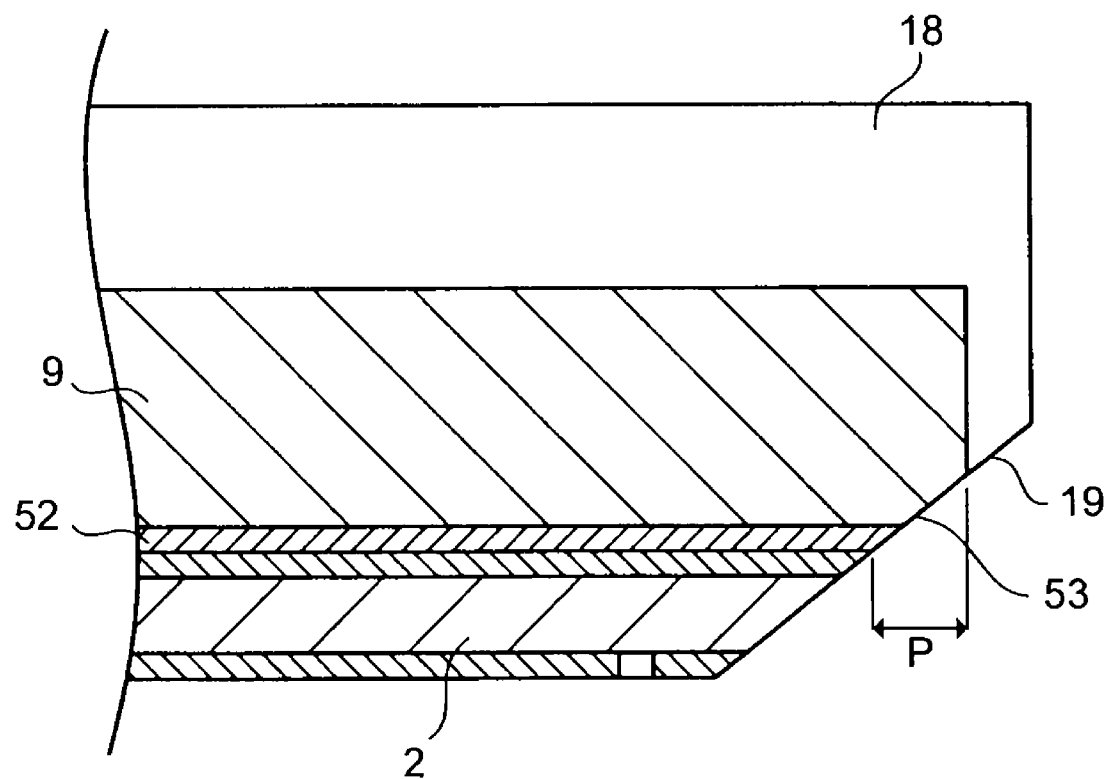
FIG. 13 is a sectional view showing another modified example of the semiconductor memory device shown in FIG. 10.

FIG. 10 through FIG. 12 show the memory card 51 having the element group 32 configured of the two memory elements 9, but the stacked number of the memory elements 9 is not limited to two. The element group 32 may be configured of three, four or more memory elements 9. As shown in FIG. 13, the memory card 51 may have a structure that one memory element 9 is mounted on the wiring board 2. In such a case, the incline 53 is formed on the memory element 9. The number of the memory elements 9 mounted on the wiring board 2 may be either one or plural. The semiconductor device configuring the memory card 51 is not limited to the mounted number of the semiconductor elements such as the memory element 9.

The controller element 10 is arranged on the element group 32. The controller element 10 has a single-long-side pad structure. The electrode pads 16 of the controller element 10 are electrically connected to the connection pads 7 arranged on the second pad region 8B through the second metal wires 17. The sealing resin layer 18 is formed on the second surface 2b of the wiring board 2 on which the memory elements 9A, 9B and the controller element 10 are mounted. The memory elements 9A, 9B and the controller element 10 are integrally sealed together with the metal wires 13, 17 by the sealing resin layer 18.

The slope portion 19 is formed on leading ends of the wiring board 2 and the sealing resin layer 18. The slope portion 19 is formed by chamfering from the first surface 2a of the wiring board 2 to the sealing resin layer 18 after the sealing resin layer 18 is mold-formed. For example, a corner of the first memory element 9A is simultaneously chamfered to form the incline 53. The first memory element 9A has a thickness that the incline 53 does not reach the circuit portion on the top surface side, and only the corner of the semiconductor substrate not affecting on the circuit portion is fabricated. Therefore, the memory element 9 having a portion (protruded portion P) protruded from the wiring board 2 can be housed into the semiconductor device configuring the memory card 51.

The memory card 51 of the fifth embodiment allows mounting of the memory element 9 which is as large as possible on the wiring board 2 whose shape and size are specified. Therefore, the memory card 51 can be provided with high capacity based on the outer shape (size) of the memory element 9. For the mounted number of the memory elements 9, the connection structure or the like of the metal wires 13 is devised to make it possible to mount large memory elements 9 by stacking into plural levels. According to the fifth embodiment, it becomes possible to provide the memory card 51 provided with high capacity on the basis of the size and stacked structure of the memory elements 9.

The memory cards 31, 41, 51 of the third through fifth embodiments configure solely a semiconductor memory card (such as a micro SD™ card) without using a housing case such as a base card. Therefore, the sealing resin layer 18 is in a state directly exposed outside. The memory cards 31, 41, 51 are casing-less semiconductor memory cards that the sealing resin layer 18 is exposed outside. A cutout portion, a recess portion and the slope portion 19 indicating the forward and backward direction, the front and rear surface direction and the like of the memory cards 31, 41, 51 are formed on the memory cards 31, 41, 51 themselves (specifically, the wiring board 2 and the sealing resin layer 18).

The memory cards 31, 41, 51 are effective for a casingless semiconductor memory card which is solely configured of them, but a semiconductor memory card using a casing such as a base card is not necessarily excluded. Besides, the structures of the third through fifth embodiments can also be applied to a semiconductor device other than the semiconductor memory card. Specifically, the device structure of the embodiment can also be applied to a BGA package, an LGA package and the like. The semiconductor device other than the semiconductor memory card has a basic structure similar to the memory card, excepting that external connection terminals (ball terminals) formed of solder balls or the like are provided on the wiring board.

Figure 14:
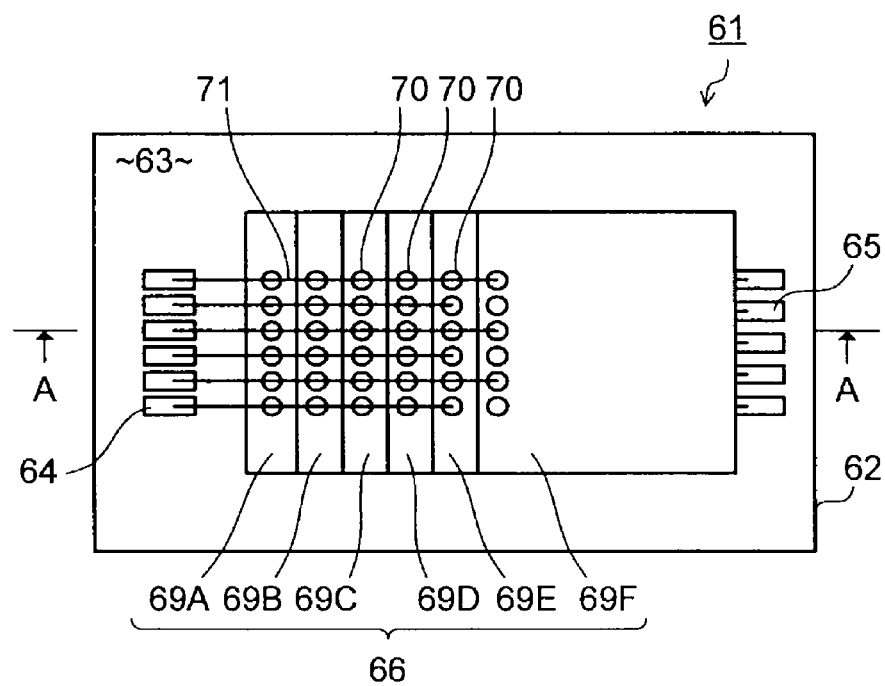
FIG. 14 is a plan view showing a semiconductor device according to a sixth embodiment.
Figure 15:
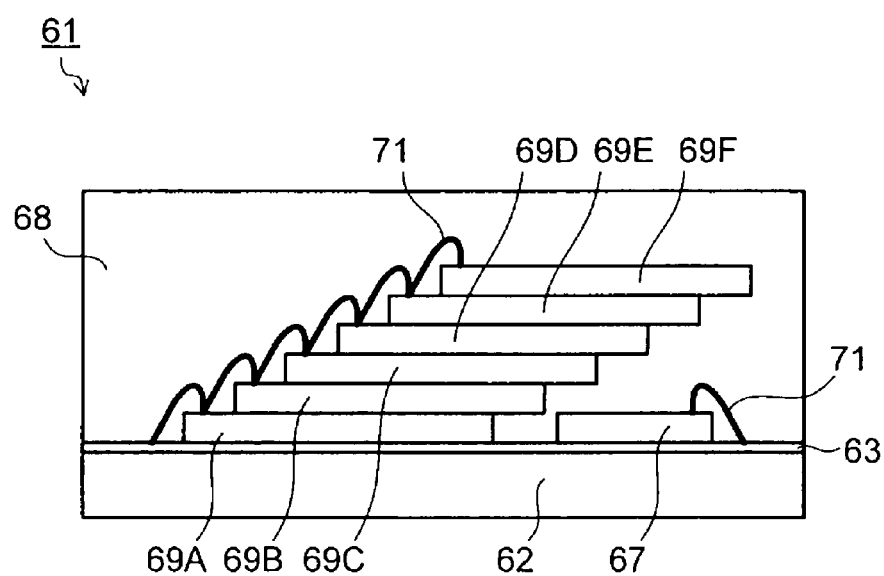
FIG. 15 is a sectional view taken along line A-A of FIG. 14.

A semiconductor device according to a sixth embodiment of the present invention is described below with reference to FIG. 14 and FIG. 15. FIG. 14 is a plan view showing the semiconductor device according to the sixth embodiment. FIG. 15 is a sectional view taken along line A-A of FIG. 14. The semiconductor device 61 shown in FIG. 14 and FIG. 15 configures, for example, a semiconductor memory device.

Specific examples of the semiconductor device (semiconductor memory device) 61 include a similar SD™ standard memory card (such as a micro SD™ card) as in the above-described embodiment. A basic structure and appearance of the semiconductor device 61 used as a memory card are the same as in the above-described embodiment. The semiconductor device (memory card) 61 may have a casing (base card) for housing the substrate on which the semiconductor element is mounted. The semiconductor device (semiconductor memory device) 61 may have a BGA package structure or an LGA package structure.

Figure 17:
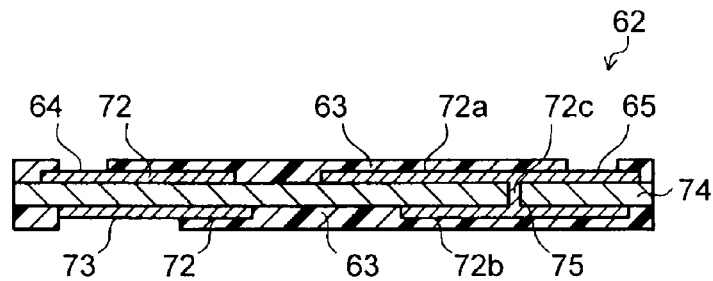
FIG. 17 is a sectional view showing a wiring board of the semiconductor device shown in FIG. 14.

The semiconductor device 61 is provided with a wiring board as a substrate 62 on which the semiconductor element is mounted. The structure of the wiring board is the same as in the above-described embodiment. A solder resist 63 is coated on the top surface of the substrate 62. The solder resist 63 has openings at prescribed positions to expose first connection pads 64 and second connection pads 65 through these openings. The connection pads 64, 65 are electrically connected to external connection terminals (such as external terminals of the memory card and solder balls of BGA) formed on the exterior (undersurface) of the substrate 62 through internal wirings (not shown) of the substrate 62. An example of the electrical connection is shown in FIG. 17 described later.

A memory element group 66 and a controller element 67 are mounted on the substrate 62. The memory element group 66 and the controller element 67 are molded by a resin sealing body 68. The resin sealing body 68 is not shown in FIG. 14. The memory element group 66 is provided with first through sixth memory elements (semiconductor memory elements) 69A to 69F. The memory elements 69A to 69F are stacked in a state displaced sequentially in one direction such that one end of each lower memory element is exposed.

The memory elements 69A to 69F are stacked in a state displaced by 100 µm or more (further 200 µm or more) in a horizontal direction to expose electrode pads 70 arranged on their one ends. In this example, the memory elements 69A to 69F have a substantially square shape and the same size. Each side of the memory element 69 has a length of about 10 mm, and its thickness is about 80 µm with a thickness of an adhesive film (not shown) added. Plural electrode pads 70 having a size of about 100 µm are provided on one ends of the memory elements 69.

The electrode pads 70 are electrically connected to the first connection pads 64 through one or plural metal wires (bonding wires) 71. The electrode pads 70 of the first memory element 69A are directly connected to the first connection pads 64 through the metal wires 71. The electrode pads 70 of the other memory elements 69B to 69F are connected to the electrode pads 70 of the lower memory elements (69A to 69E) through the metal wires 71 and indirectly connected to the first connection pads 64 through the other electrode pads 70 and metal wires 71.

The controller element 67 controls the memory elements 69A to 69F. The electrode pads of the controller element 67 are electrically connected to the second connection pads 65 through the metal wires 71. In this example, the controller element 67 has a rectangular shape having a long side of about 2 to 4 mm and a short side of about 2 mm. The controller element 67 is arranged on a part of the substrate 62 corresponding to the position below the eaves-like portion formed by the memory element group 66. In other words, the controller element 67 is arranged below the eaves-like portion formed of the other ends of the memory elements 69A to 69F protruded sequentially. The controller element 67 is entirely or partially covered with the eaves-like portion.

Thus, when the controller element 67 is arranged below the eaves-like portion of the memory element group 66, the thickness of the memory element group 66 can be increased in comparison with a case that the controller element 67 is arranged on the memory element group 66. Therefore, it becomes possible to increase the stacked number of the memory elements 69 without decreasing the thickness of the memory elements 69A to 69F and increasing the area of the substrate 62.

The circuit base material arranged below the eaves-like portion is not limited to the controller element 67. Instead of the controller element 67, another semiconductor element may be arranged below the eaves-like portion. The circuit base material arranged below the eaves-like portion may be an electronic component such as a capacitor, and the semiconductor element and the electronic component maybe arranged as described in the embodiment below. The mounted number of the controller element 67 is not limited to one. The number of the memory elements 69 configuring the memory element group 66 is not limited to six.

Figure 16A:
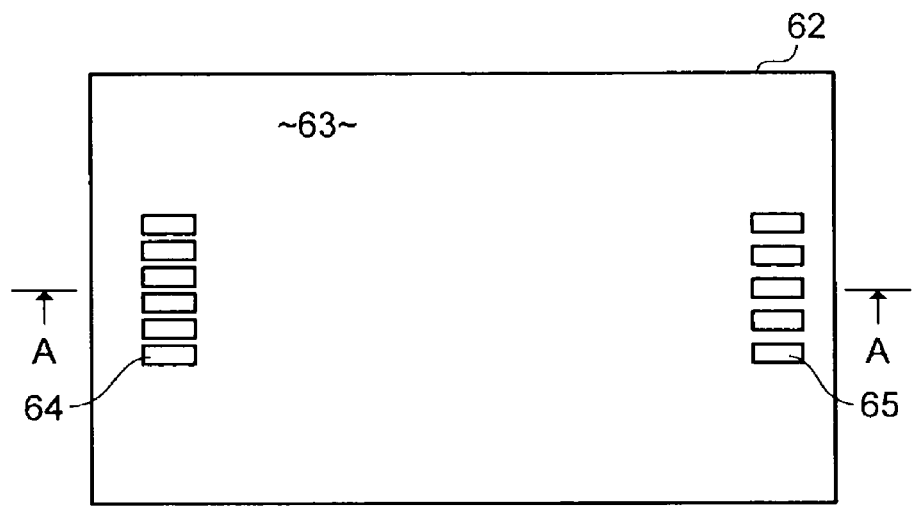
FIG. 16A to FIG. 16D are plan views showing a production process of the semiconductor device shown in FIG. 14.
Figure 16B:
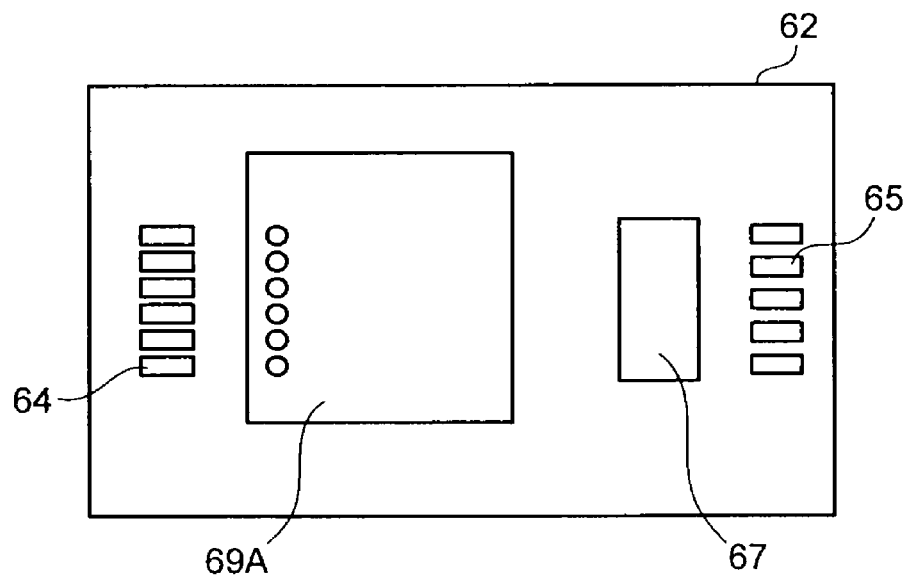

For example, the semiconductor device 61 according to the sixth embodiment is produced as follows. First, openings are formed in prescribed positions of the solder resist 63 coated onto the substrate 62 as shown in FIG. 16A and FIG. 17 to expose the internal wirings 72 partially. The exposed portions of the internal wirings 72 are plated with gold or the like to form the first connection pads 64 and the second connection pads 65. As shown in FIG. 16B, the controller element 67 and the first memory element 69A are mounted on the substrate 62.

Figure 16C:
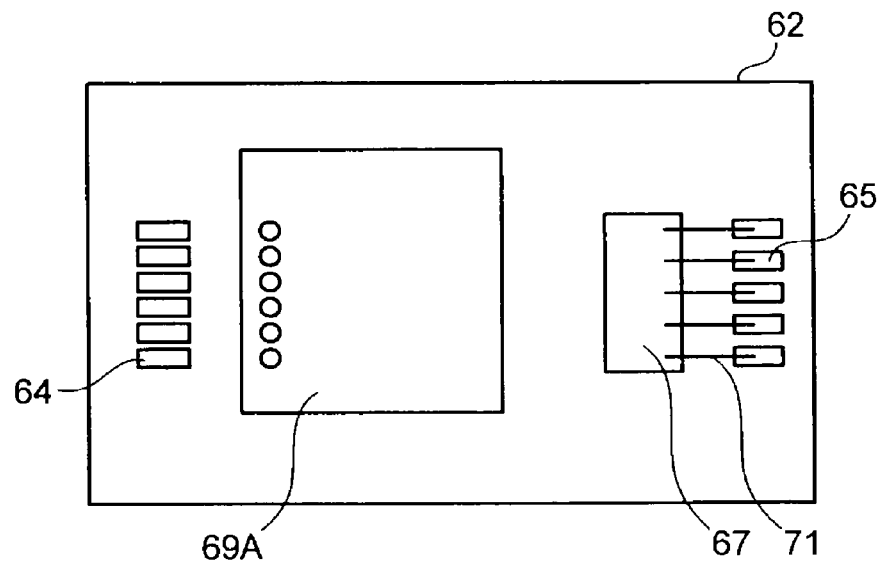
Figure 16D:
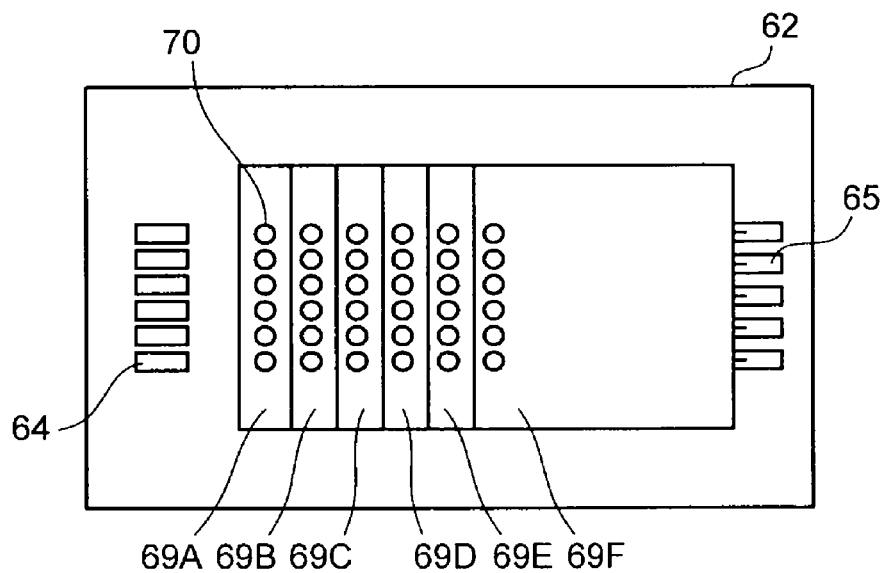

As shown in FIG. 16C, the second connection pads 65 and the controller element 67 are electrically connected through the metal wires 71. As shown in FIG. 16D, the second memory element 69B is stacked on the first memory element 69A in a state displaced in a horizontal direction to expose the electrode pads 70 of the first memory element 69A. Similarly, the third through sixth memory elements 69C to 69F are sequentially stacked to form the memory element group 66. The controller element 67 is covered by the eaves-like portion of the memory element group 66.

As shown in FIG. 15, the electrode pads 70 of vertically overlapped memory elements 69 are electrically connected mutually through the metal wires 71. The electrode pads 70 of the lowermost first memory element 69A and the first connection pads 64 are electrically connected through the metal wires 71. Lastly, the memory element group 66, the controller element 67 and the metal wires 71 are molded by the resin sealing body 68. Thus, the semiconductor device 61 is produced.

Here, the electrical connection of the connection pads 64, 65 and the external connection terminals 72 on the substrate 62 is described with reference to FIG. 16A and FIG. 17. FIG. 16A is a plan view of the substrate 62 and FIG. 17 is a sectional view taken along line A-A of FIG. 16A. The substrate 62 is provided with the first and second connection pads 64, 65, a prepreg (substrate body) 74, through holes 75, the solder resist 63, wiring layers 72 (72a, 72b, 72c), and an external connection terminal 73.

The prepreg 74 has an inner surface (top surface) which becomes the inside of the semiconductor device 61, an outer surface (undersurface) which becomes the exterior and the through holes 75. The wiring layers 72 are made of a conductive material (copper or aluminum) and have a wiring pattern 72a provided on the inner surface, a wiring pattern 72b provided on the exterior surface and a via 72c filled into the through holes 75. The vias 72c are to electrically connect the inner wiring pattern 72a and the exterior wiring pattern 72b.

The external connection terminals 73 are formed by conducting metal-plating (not shown) such as Ni/Au plating on a part of the exterior wiring pattern 72b. The connection pads 64, 65 are formed by conducting metal-plating (not shown) of Au or the like on the inner wiring pattern 72a through the openings formed in the solder resist 63. The connection pads 64, 65 are electrically connected to the external connection terminals 72 through the wiring layers 72 (72a, 72b, 72c).

Figure 18:
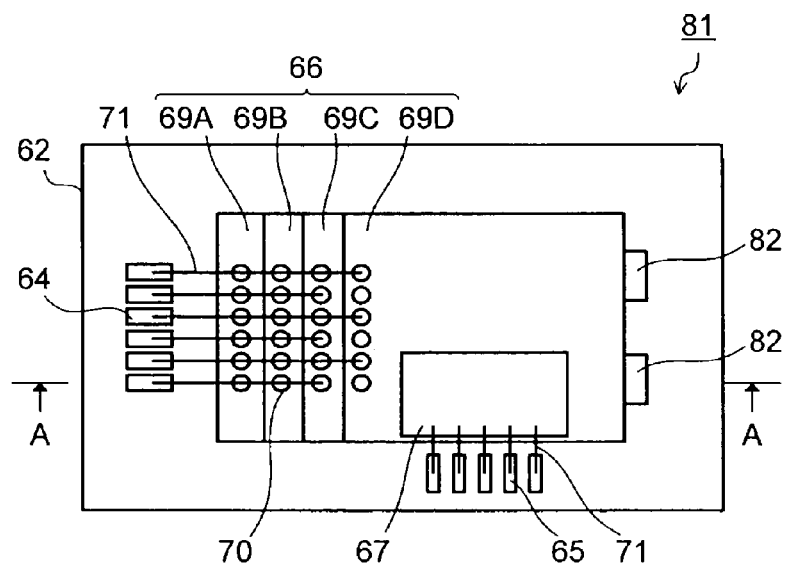
FIG. 18 is a plan view showing a semiconductor device according to a seventh embodiment.
Figure 19:
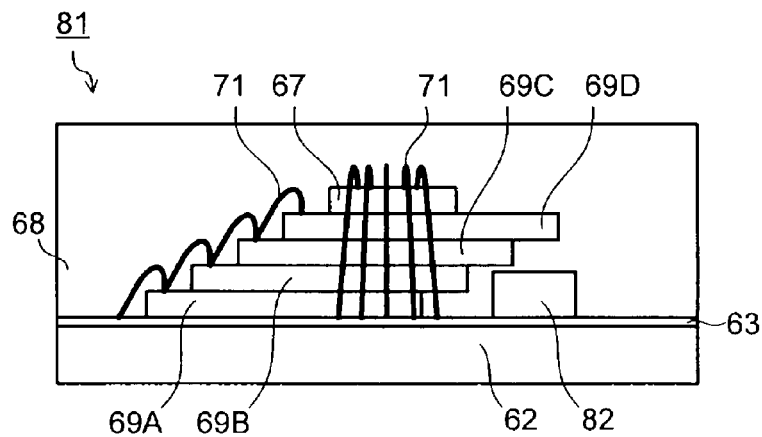
FIG. 19 is a sectional view taken along line A-A of FIG. 18.

A semiconductor device according to a seventh embodiment of the present invention is described with reference to FIG. 18 and FIG. 19. FIG. 18 is a plan view showing the semiconductor device according to the seventh embodiment. FIG. 19 is a sectional view taken along line A-A of FIG. 18. The semiconductor device 81 shown in FIG. 18 and FIG. 19 has the memory element group 66 (first through fourth semiconductor elements 69A to 69D) and two capacitors 82 mounted on the substrate 62. The controller element 67 is stacked on the memory element group 66.

The capacitor 82 is a bypass capacitor which absorbs a change in power source voltage, and electrically connected to the wiring layer (inner wiring pattern) of the substrate 62. The two capacitors 82 are arranged below the eaves-like portion which is formed by the memory element group 66 and covered entirely or partly by the eaves-like portion. Thus, it becomes possible to mount the capacitors 82 on the substrate 62 without increasing the area of the substrate 62. The mounting number of the capacitors is not limited to two. Another electronic component may be mounted instead of the capacitor, or the capacitors may be mounted together with another electronic component.

Figure 20A:
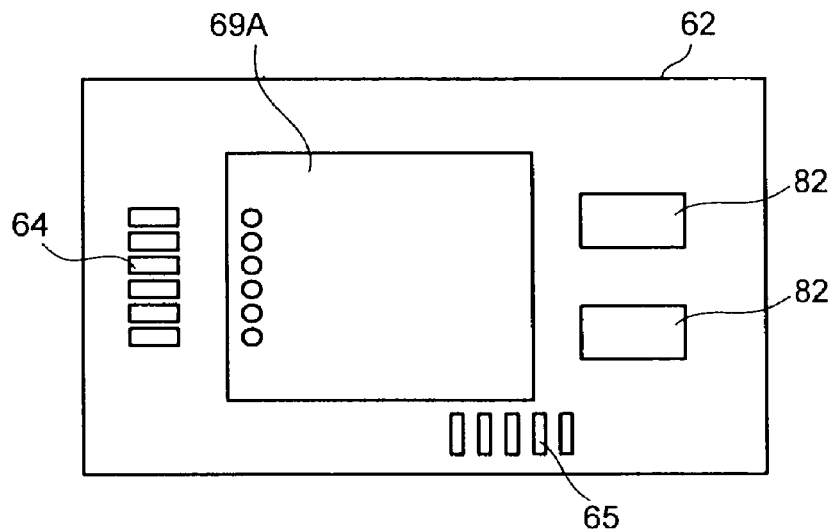
FIG. 20A and FIG. 20B are plan views showing a production process of the semiconductor device shown in FIG. 18.
Figure 20B:
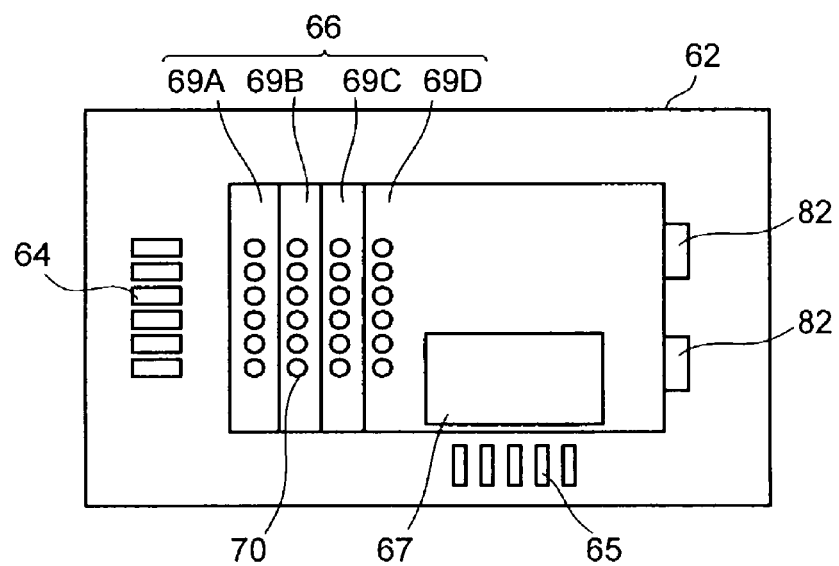

For example, the semiconductor device 81 according to the seventh embodiment is produced as follows. The first and second connection pads 64, 65 are formed on the substrate 62 in the same manner as in the sixth embodiment. As shown in FIG. 20A, the first memory element 69A and two capacitors 82 are mounted on the substrate 62. As shown in FIG. 20B, the second memory element 69B is stacked on the first memory element 69A in a state displaced in a horizontal direction. Similarly, the third and fourth memory elements 69C, 69D are stacked to form the memory element group 66. The two capacitors 82 are covered by the eaves-like portion of the memory element group 66.

As shown in FIG. 18 and FIG. 19, the electrode pads 70 of the vertically overlapped memory elements 69 are electrically connected mutually through the metal wires 71. The electrode pads 70 of the lowermost first memory element 69A and the first connection pads 64 are electrically connected through the metal wires 71. The second connection pads 65 and the controller element 67 are electrically connected through the metal wires 71. Lastly, the memory element group 66, the controller element 67 and the metal wires 71 are molded by the resin sealing body 68. Thus, the semiconductor device 81 is produced.

Figure 21:
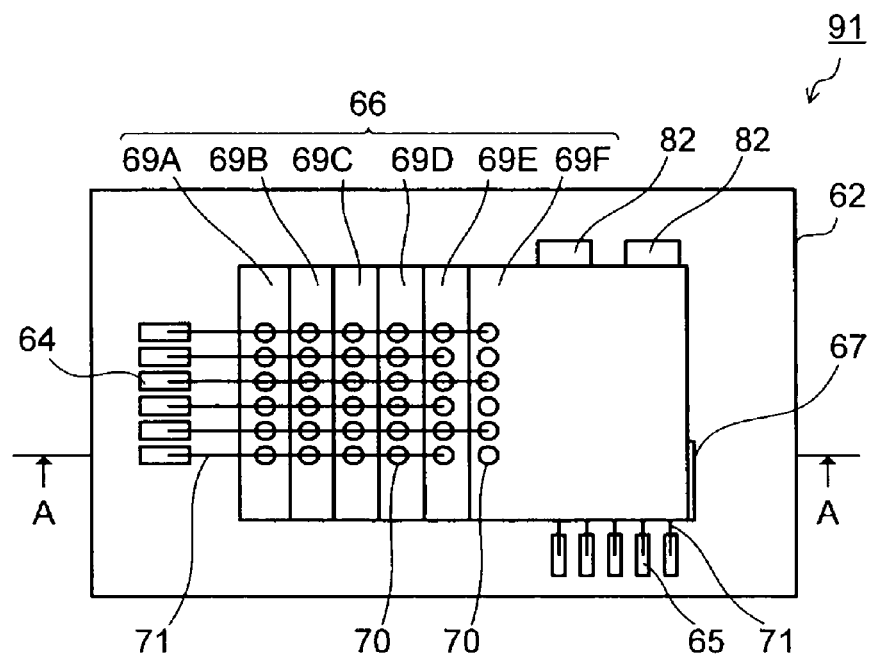
FIG. 21 is a plan view showing a semiconductor device according to an eighth embodiment.
Figure 22:
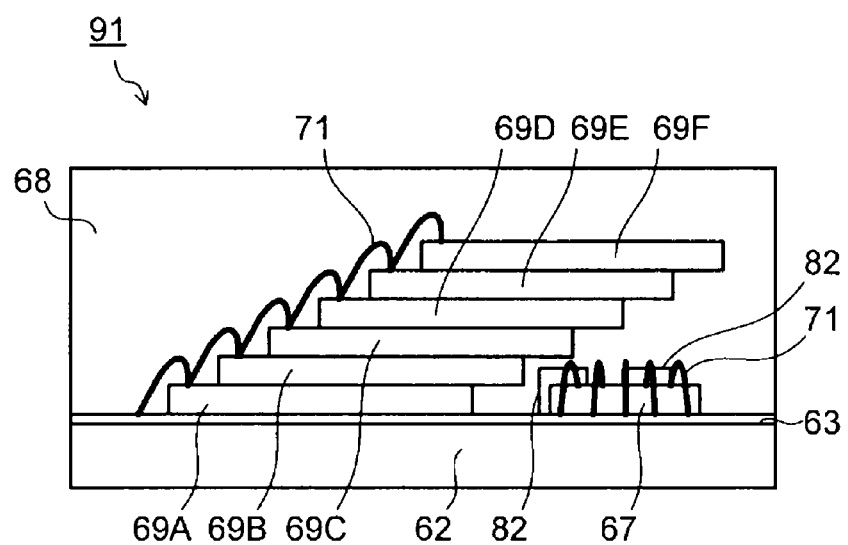
FIG. 22 is a sectional view taken along line A-A of FIG. 21.

A semiconductor device according to an eighth embodiment of the present invention is described below with reference to FIG. 21 and FIG. 22. FIG. 21 is a plan view showing the semiconductor device according to the eighth embodiment. FIG. 22 is a sectional view taken along line A-A of FIG. 21. In the semiconductor device 91 shown in FIG. 21 and FIG. 22, a memory element group 66 (first through sixth semiconductor elements 69A to 69F), a controller element 67 and two capacitors 82 are mounted on the substrate 62. The controller element 67 and the two capacitors 82 are arranged below the eaves-like portion of the memory element group 66, and they are entirely or partly covered by the eaves-like portion.

Thus, the stacked number of the memory elements 69 can be increased without decreasing the thickness of the memory elements 69A to 69F and increasing the area of the substrate 62. In addition, the capacitors 82 can be mounted on the substrate 62 without increasing the area of the substrate 62. The mounted number of the controller element 67 is not limited to one. Another semiconductor element may be mounted instead of the controller element 67. The mounted number of the capacitors is not limited to two. Another electronic component may be mounted instead of the capacitors, or the capacitors may be mounted together with another electronic component.

Figure 23A:
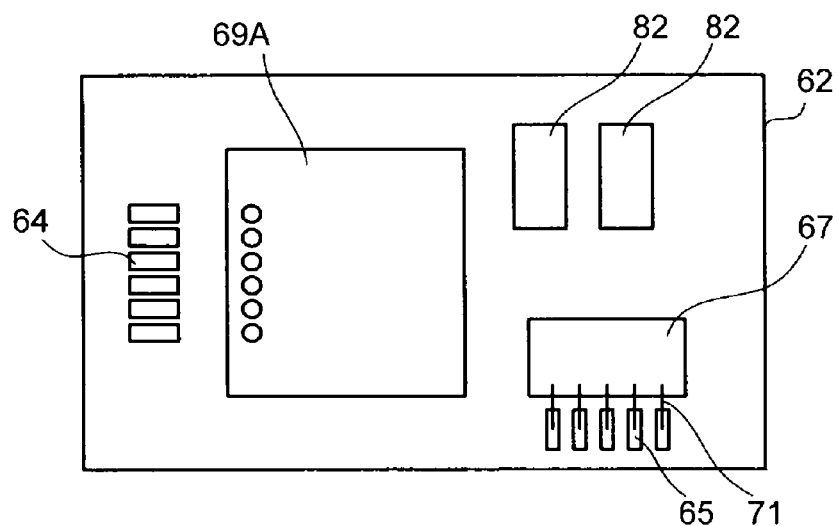
FIG. 23A and FIG. 23B are plan views showing a production process of the semiconductor device shown in FIG. 21.

For example, the semiconductor device 91 according to the eighth embodiment is produced as follows. Similar to the sixth embodiment, the first and second connection pads 64, 65 are formed on the substrate 62. As shown in FIG. 23A, the first memory element 69A, the controller element 67 and the two capacitors 82 are mounted on the substrate 62. The second connection pads 65 and the controller element 67 are electrically connected through the metal wires 71.

Figure 23B:
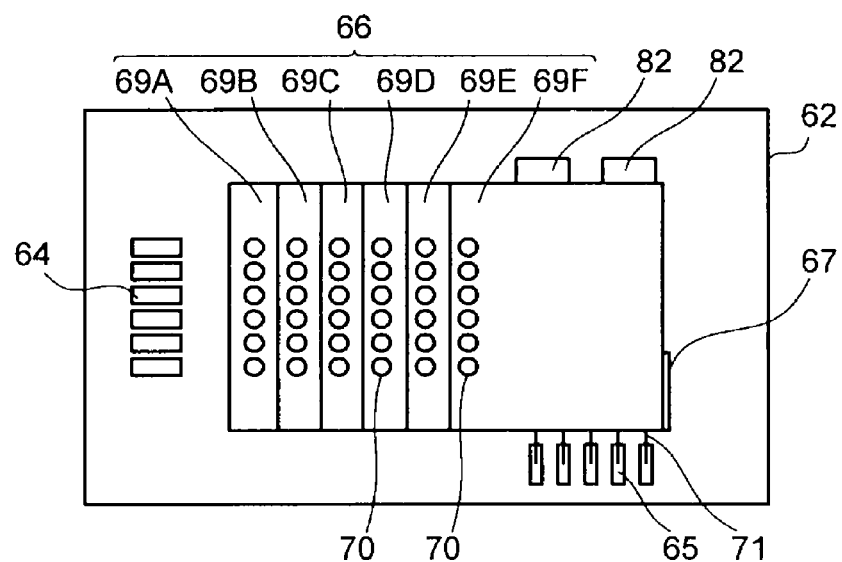

Then, the second memory element 69B is stacked in a state displaced in a horizontal direction on the first memory element 69A as shown in FIG. 23B. The third through sixth memory elements 69C to 69F are stacked to form the memory element group 66. The controller element 67 and the two capacitors 82 are covered by the eaves-like portion of the memory element group 66.

As shown in FIG. 21 and FIG. 22, the electrode pads 70 of the vertically overlapped memory elements 69 are electrically connected mutually through the metal wires 71. The electrode pads 70 of the lowermost first memory element 69A and the first connection pads 64 are electrically connected through the metal wires 71. Lastly, the memory element group 66, the controller element 67 and the metal wires 71 are molded by a resin sealing body 68. Thus, the semiconductor device 91 is produced.

Figure 24:
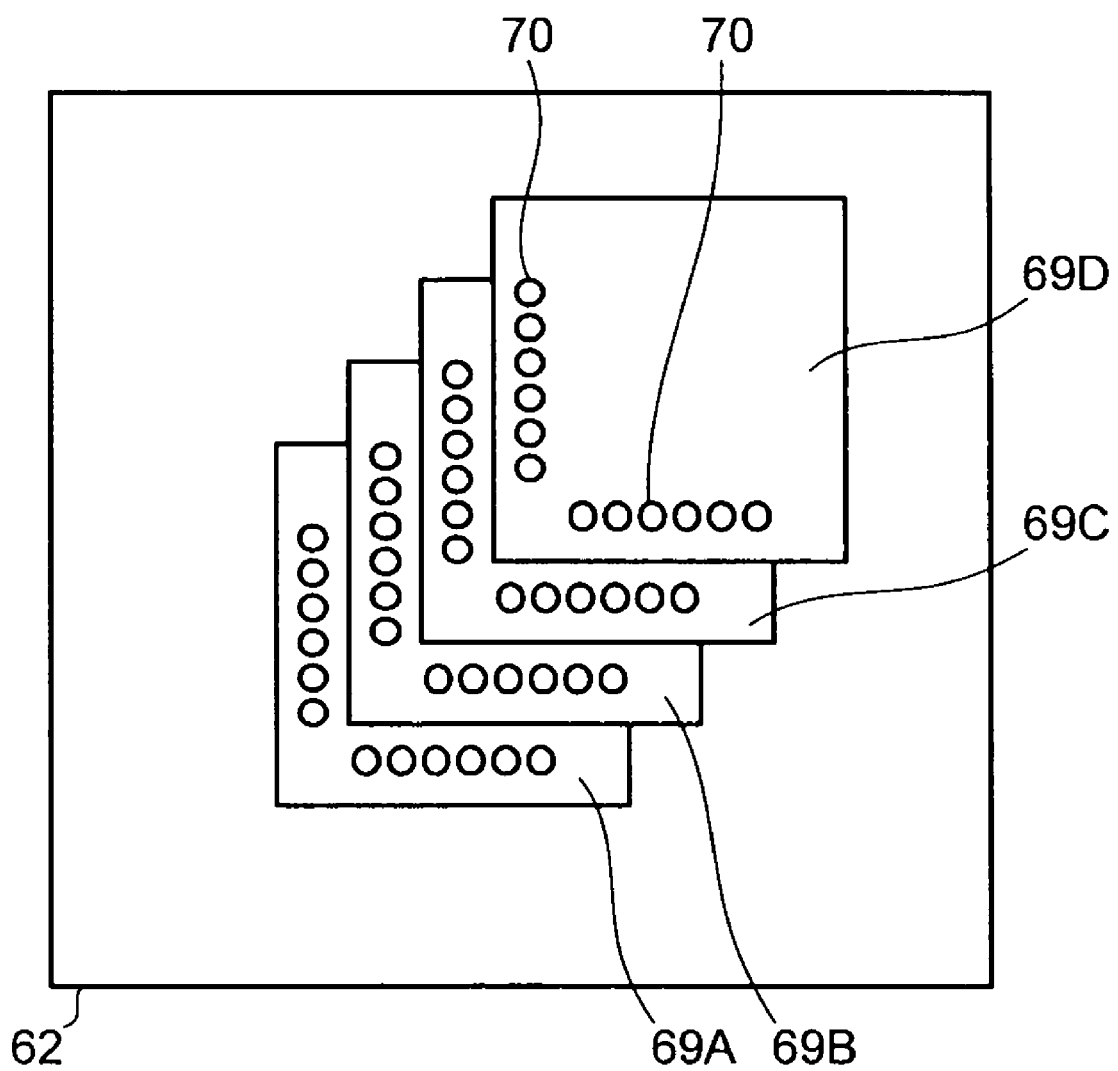
FIG. 24 is a plan view showing a modified example of the semiconductor device of the embodiment.

The sixth through eighth embodiments show the state that the memory elements (semiconductor elements) 69 are stacked in the state displaced in the long side direction of the substrate 62. But, the method of stacking the semiconductor elements is not limited to the above. The plural semiconductor elements may be stacked in a state displaced in an oblique direction as shown in FIG. 24. The plural semiconductor elements may be stacked sequentially in a state displaced into a step-like shape such that one ends become exposed portions while the other ends become the eaves-like portion.

The semiconductor device of the present invention is not limited to the above-described embodiments but can be applied to various types of semiconductor memory devices provided with the semiconductor elements mounted on the substrate and other semiconductor devices. The specific structure of the semiconductor device of the present invention can be modified in various ways if the basic structure of the present invention is satisfied. The embodiments of the present invention can be expanded or modified within the scope of technical idea of the invention, and the expanded and modified embodiments are also included in the technical scope of the invention.

What is claimed is:

1. A semiconductor device, comprising:
a wiring board having a first surface provided with external connection terminals and a second surface provided with an element mounting section and connection pads;
a first element group provided with a plurality of first semiconductor elements having first electrode pads arranged along one outline side, the first semiconductor elements being stacked in a step shape on the element mounting section of the wiring board with the outline sides directed to the same direction and the first electrode pads exposed;
a second element group provided with a plurality of second semiconductor elements having second electrode pads arranged along one outline side, the second semiconductor elements being stacked in a step shape on the first element group in a direction opposite to the stepped direction of the first element group with the outline sides directed to the same direction and the electrode pads exposed;
metal wires electrically connecting the first and second electrode pads of the first and second semiconductor elements and the connection pads of the wiring board; and
a sealing resin layer formed on the second surface of the wiring board to seal the first and second element group together with the metal wires,
wherein the second element group satisfies conditions T1=1.1TA to 1.5TA, T2=2.5TA to 3.5TA, where a thickness of the uppermost second semiconductor element in the second element group is T1, a thickness of the lowermost second semiconductor element in the second element group is T2, and a thickness of the other second semiconductor elements in the second element group is TA.

2. The semiconductor device according to claim 1, wherein the first element group satisfies a condition T3=1.5TB to 2.5TB, where a thickness of the lowermost first semiconductor element in the first element group is T3, and a thickness of the other first semiconductor elements in the first element group is TB.

3. The semiconductor device according to claim 1, wherein the thickness TA of the other second semiconductor elements are in a range of 10 to 50 μm.

4. The semiconductor device according to claim 1, wherein the first and second element group is provided with a plurality of memory elements as the first and second semiconductor elements.

5. The semiconductor device according to claim 4, further comprising:
a controller element, stacked on the second element group, having electrode pads arranged along a outline side.

6. The semiconductor device according to claim 5, wherein the electrode pads of the controller element are electrically connected to the connection pads of the wiring board via metal wires.

7. A semiconductor device, comprising:
a wiring board having a first surface provided with external connection terminals and a second surface provided with an element mounting section and connection pads;
an element group, mounted on the element mounting section of the wiring board, including at least one semiconductor element having electrode pads arranged along a outline side;
metal wires electrically connecting the connection pads of the wiring board and the electrode pads of the semiconductor element;
a sealing resin layer formed on the second surface of the wiring board to seal the element group together with the metal wires; and
a slope portion formed on ends of the wiring board and the sealing resin layer ranging from the first surface of the wiring board to the sealing resin layer,
wherein the semiconductor element is arranged on the wiring board via a dummy element having a size which fits in an outer shape of the wiring board, and an end of the semiconductor element is protruded from the end of the wiring board to locate above the slope portion.

8. The semiconductor device according to claim 7, wherein the dummy element has a thickness that the slope portion does not interfere with the semiconductor element.

9. A semiconductor device, comprising:
a wiring board having a first surface provided with external connection terminals and a second surface provided with an element mounting section and connection pads;
an element group, mounted on the element mounting section of the wiring board, including at least one semiconductor element having electrode pads arranged along a outline side;
metal wires electrically connecting the connection pads of the wiring board and the electrode pads of the semiconductor element;
a sealing resin layer formed on the second surface of the wiring board to seal the element group together with the metal wires; and
a slope portion formed on ends of the wiring board and the sealing resin layer ranging from the first surface of the wiring board to the sealing resin layer,
wherein the semiconductor element is arranged on the wiring board via an adhesive layer having an incline corresponding to the slope portion, and an end of the semiconductor element is protruded from the end of the wiring board to locate above the slope portion.

10. The semiconductor device according to claim 9, wherein the adhesive layer has a thickness that the slope portion does not interfere with the semiconductor element.

11. A semiconductor device, comprising:
a wiring board having a first surface provided with external connection terminals and a second surface provided with an element mounting section and connection pads;
an element group, mounted on the element mounting section of the wiring board, including at least one semiconductor element having electrode pads arranged along a outline side;
metal wires electrically connecting the connection pads of the wiring board and the electrode pads of the semiconductor element;
a sealing resin layer formed on the second surface of the wiring board to seal the element group together with the metal wires; and
a slope portion formed on ends of the wiring board and the sealing resin layer ranging from the first surface of the wiring board to the sealing resin layer,
wherein the semiconductor element has an incline corresponding to the slope portion, and an end of the semiconductor element is protruded from the end of the wiring board to locate above the slope portion.

12. The semiconductor device according to claim 11, wherein the semiconductor element has a thickness that the incline does not interfere with a circuit portion provided on the semiconductor element.

13. The semiconductor device according to claim 11, wherein the element group is provided with a plurality of the semiconductor elements, and the lowermost semiconductor element among the semiconductor elements has the incline.

14. A semiconductor device, comprising:
a wiring board having a first surface provided with external connection terminals and a second surface provided with an element mounting section and connection pads;
an element group provided with a plurality of semiconductor elements having electrode pads arranged along one outline side, the semiconductor elements being stacked in a step shape displaced to one direction on the element mounting section of the wiring board with the outline sides directed to the same direction and the electrode pads exposed;
metal wires electrically connecting the electrode pads of the semiconductor elements and the connection pads of the wiring board; and
a sealing resin layer formed on the second surface of the wiring board to seal the element group together with the metal wires,
wherein the element group satisfies conditions T1=1.1T to 1.5T, T2=2.5T to 3.5T, where a thickness of the uppermost semiconductor element in the element group is T1, a thickness of the lowermost semiconductor element in the element group is T2, and a thickness of the other semiconductor elements in the element group is T.

15. The semiconductor device according to claim 14, wherein the thickness T of the other semiconductor elements are in a range of 10 to 50 μm.

16. The semiconductor device according to claim 14, wherein the element group is provided with a plurality of memory elements as the semiconductor elements.

17. The semiconductor device according to claim 16, further comprising:
a controller element, stacked on the element group, having electrode pads arranged along an outline side.

18. The semiconductor device according to claim 17, wherein the electrode pads of the controller element are electrically connected to the connection pads of the wiring board via metal wires.

* * * * *